US012183700B2

(12) United States Patent
Wu et al.

(10) Patent No.: US 12,183,700 B2
(45) Date of Patent: Dec. 31, 2024

(54) SEMICONDUCTOR DEVICE PACKAGE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 10 days.

(21) Appl. No.: 17/874,402

(22) Filed: Jul. 27, 2022

(65) Prior Publication Data

US 2022/0359445 A1 Nov. 10, 2022

Related U.S. Application Data

(62) Division of application No. 17/002,471, filed on Aug. 25, 2020, now Pat. No. 11,532,582.

(51) Int. Cl.
*H01L 23/00* (2006.01)
*H01L 21/02* (2006.01)
(Continued)

(52) U.S. Cl.
CPC ........ *H01L 24/13* (2013.01); *H01L 21/02065* (2013.01); *H01L 21/4853* (2013.01);
(Continued)

(58) Field of Classification Search
CPC .......... H01L 21/76895; H01L 21/7684; H01L 21/02065; H01L 21/4846–4867; H01L 21/4807–481; H01L 21/568; H01L 21/683–68792; H01L 2021/6006; H01L 2221/68304–68395; H01L 33/0093; H01L 51/003; H01L 23/498–49894;
(Continued)

(56) References Cited

U.S. PATENT DOCUMENTS 8,581,420 B2 11/2013 Tsai et al.
8,993,380 B2 3/2015 Hou et al.
(Continued)

*Primary Examiner* — Victor A Mandala
*Assistant Examiner* — Lawrence C Tynes, Jr.
(74) *Attorney, Agent, or Firm* — Slater Matsil, LLP

(57) ABSTRACT

Semiconductor devices and methods of manufacture are described herein. The methods include forming a local organic interconnect (LOI) by forming a stack of conductive traces embedded in a passivation material, forming first and second local contacts over the passivation material, the second local contact being electrically coupled to the first local contact by a first conductive trace of the stack. The methods further include forming a backside redistribution layer (RDL) and a front side RDL on opposite sides of the LOI with TMVs electrically coupling the backside and front side RDLs to one another. First and second external contacts are formed over the backside RDL for mounting of semiconductor devices, the first and second external contacts being electrically connected to one another by the LOI. An
(Continued)

interconnect structure is attached to the front side RDL for further routing. External connectors electrically coupled to the external contacts at the backside RDL.

20 Claims, 24 Drawing Sheets

(51) Int. Cl.
    *H01L 21/48*     (2006.01)
    *H01L 21/56*     (2006.01)
    *H01L 21/768*     (2006.01)
    *H01L 23/31*     (2006.01)
    *H01L 23/498*     (2006.01)
    *H01L 23/538*     (2006.01)

(52) U.S. Cl.
    CPC ............ *H01L 21/486* (2013.01); *H01L 21/56* (2013.01); *H01L 21/7684* (2013.01); *H01L 21/76895* (2013.01); *H01L 23/3128* (2013.01); *H01L 23/49816* (2013.01); *H01L 23/5389* (2013.01); *H01L 24/02* (2013.01); *H01L 24/05* (2013.01); *H01L 2224/02333* (2013.01); *H01L 2224/11849* (2013.01)

(58) Field of Classification Search
    CPC ..... H01L 23/538–5389; H01L 23/3128; H01L 23/49822; H01L 23/4985; H01L 23/49861
    See application file for complete search history.

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 11,488,906 B2 * | 11/2022 | Cho | H01L 23/49838 |
| 2011/0237026 A1 | 9/2011 | Farooq et al. | |
| 2014/0360759 A1 * | 12/2014 | Kunieda | H01L 23/5381 174/251 |
| 2014/0367160 A1 * | 12/2014 | Yu | H01L 21/7684 174/377 |
| 2015/0001733 A1 * | 1/2015 | Karhade | H01L 23/5386 257/782 |
| 2016/0300813 A1 * | 10/2016 | Zhai | H01L 25/0652 |
| 2017/0062383 A1 * | 3/2017 | Yee | H01L 24/09 |
| 2017/0125349 A1 * | 5/2017 | Roy | H01L 23/49894 |
| 2018/0102311 A1 * | 4/2018 | Shih | H01L 23/49827 |
| 2020/0176378 A1 * | 6/2020 | Wu | H01L 23/5226 |
| 2020/0243448 A1 * | 7/2020 | Qian | H01L 21/4853 |
| 2021/0305162 A1 * | 9/2021 | Ganesan | H01L 23/5381 |

* cited by examiner

SEMICONDUCTOR DEVICE PACKAGE AND METHOD OF MANUFACTURE

PRIORITY CLAIM AND CROSS-REFERENCE

This application is a divisional of U.S. patent application Ser. No. 17/002,471, filed on Aug. 25, 2020, now U.S. Pat. No. 11,532,582, issued Dec. 20, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
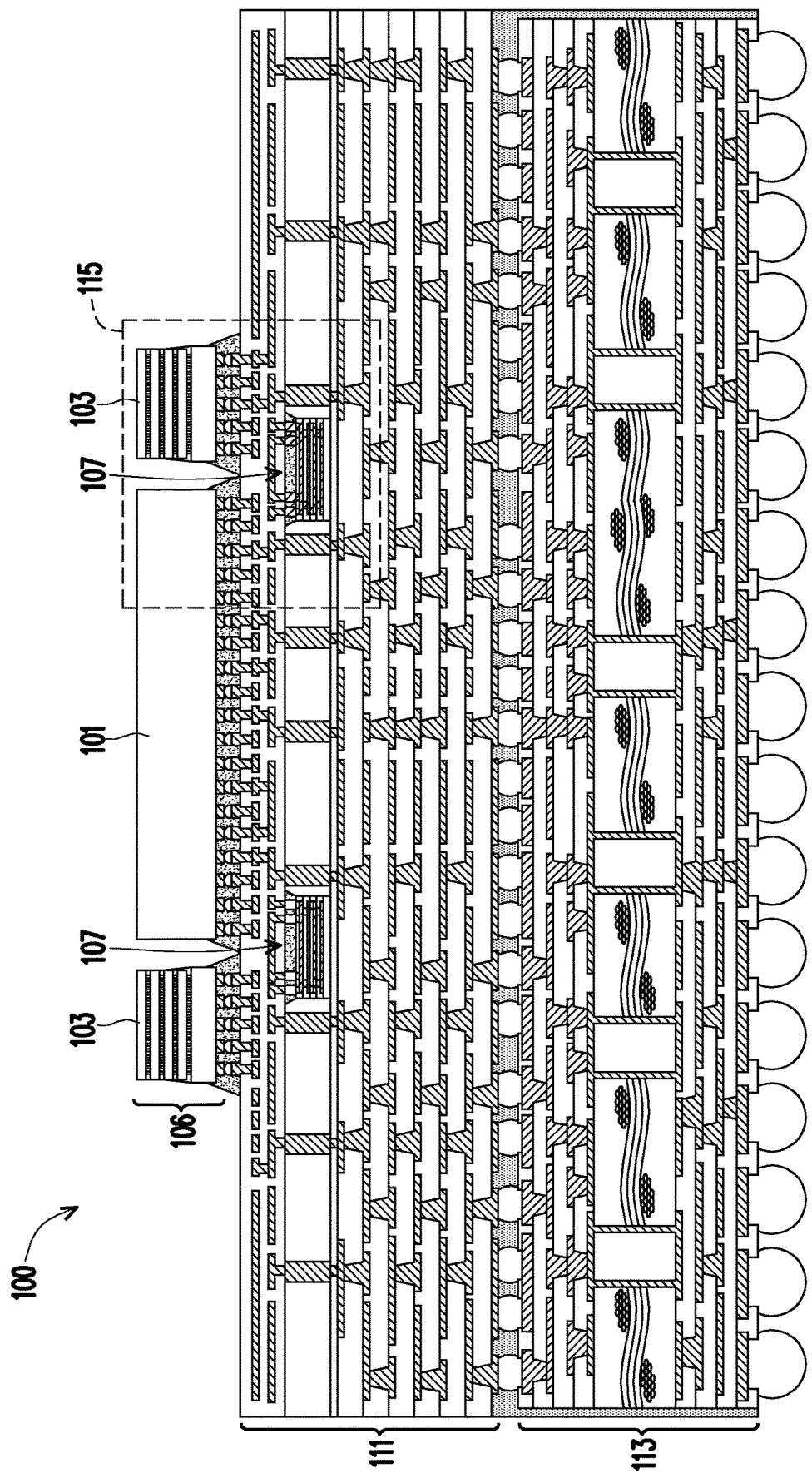
FIG. 1 illustrates a cross-sectional view of a system package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a system package 100 (e.g., a system on integrated substrate (SoIS)), in accordance with some embodiments. The system package 100 comprises one or more semiconductor devices 106 that are stacked on top of an integrated substrate structure 111 in a package-on-package (PoP) arrangement (e.g., system on integrated substrate (SoIS)). The semiconductor devices 106 may comprise devices such as system devices 101 (e.g., system-on-chip (SoC)), memory devices 103 (e.g., high-bandwidth memory (HBM)), and input/output devices 105 (e.g., I/O chips) (not shown in the precise cross section of FIG. 1, but illustrated below with respect to FIG. 2). The package-on-package (PoP) arrangement of the system package 100 provides a high level of system integration and component density. The integrated substrate structure 111 comprises one or more of the local interconnects 107 which electrically connect the system devices 101, the memory devices 103, and the input/output devices 105 to one another. FIG. 1 further illustrates a section 115 highlighting an arrangement between two of the semiconductor devices 106 electrically coupled to one another by one of the local interconnects 107. Furthermore, FIG. 1 illustrates an interconnect structure 113 attached to the integrated substrate structure 111 for external connection to the system package 100.

In addition, FIG. 1 illustrates a first arrangement of the system devices 101, the memory devices 103, and the input/output devices 105 according to a particular embodiment. The system devices 101, the memory devices 103, and the input/output devices 105 may be arranged in any suitable pattern and the local interconnects 107 may be connected between any suitable combination of adjacent ones of the system devices 101, the memory devices 103, and the input/output devices 105. Furthermore, the local interconnect 107 may also be referred to herein as local organic interconnect (LOI), embedded local organic interconnect (eLOI), organic bus (ORG-bus), or embedded organic bus (eORG-bus). In some embodiments, the local interconnects 107 may comprise other integrated devices such as integrated passive devices (IPDs), integrated voltage regulators (IVRs), static random access memory (SRAM), combinations of these, or the like. In other embodiments, the local interconnects 107 may be substantially free of such devices.

Figure 2:
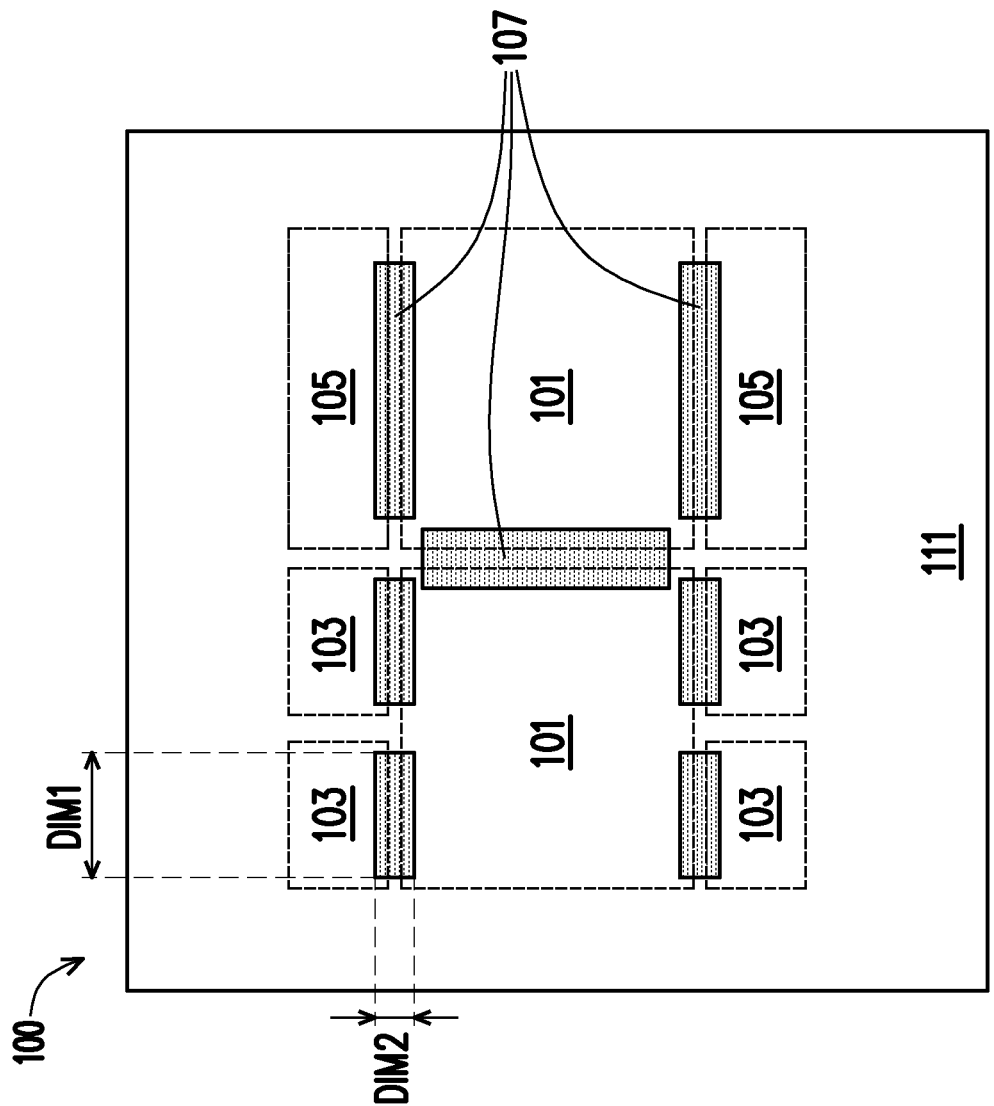
FIG. 2 illustrates a top-down view of the system package, in accordance with some embodiments.

FIG. 2 illustrates a top-down view of the system package 100, in accordance with a particular embodiment. The system package 100 comprises the system devices 101, the memory devices 103, and the input/output devices 105 are stacked on top of the integrated substrate structure 111 in a package-on-package (PoP) design which provides a high level of system integration and component density. In FIG. 2, the system devices 101, the memory devices 103, and the input/output devices 105 are illustrated as transparent to show the local interconnects 107 connecting adjacent devices one to another. Furthermore, FIG. 2 illustrates an arrangement of the system devices 101, the memory devices 103, and the input/output devices 105 according to a particular embodiment.

In some embodiments, the local interconnects 107 are used to form interconnections or additional routing between other devices in a package, such as semiconductor devices, dies, chips, or the like, as discussed above. In some embodiments, the local interconnects 107 comprise one or more active devices (e.g., transistors, diodes, or the like) and/or one or more passive devices (e.g., capacitors, resistors, inductors, or the like). However, in other embodiments, the local interconnects 107 include one or more layers of additional routing and is substantially free of active or passive devices. In some embodiments, the local interconnects 107 may have lateral dimensions (DIM1×DIM2) between about 2 mm×3 mm and about 50 mm×80 mm. However, the local interconnects 107 may have any suitable lateral dimensions.

In some embodiments, the electrical routing internal to the local interconnects 107 may comprise fine-pitch RDLs having a pitch less than about 1 µm. By forming the electrical routing having a fine pitch, the density of the electrical routing in the local interconnects 107 may be increased, thus improving the routing ability of the local interconnects 107. In some cases, a higher density of electrical routing in the local interconnects 107 may allow a smaller amount of routing to be formed elsewhere in a package. This can decrease the size of a package, reduce the processing cost of a package, or improve performance by reducing the routing distances within a package. In some cases, the use of a fine-pitch formation process (e.g., a damascene or duel damascene process) may allow for improved conduction and connection reliability within the local interconnects 107. In some cases, during high-speed operation (e.g., greater than about 2 Gbit/sec), electrical signals may be conducted near the surfaces of conductive components. Fine-pitch routing may have less surface roughness than other types of routing, and thus can reduce resistance experienced by higher-speed signals and also reduce signal loss (e.g., insertion loss) during high-speed operation. This can improve the performance of high-speed operation, for example, of "Ser/Des" (Serializer/Deserializer) circuits or other types of circuits that may be operated at higher speeds.

Figure 3:
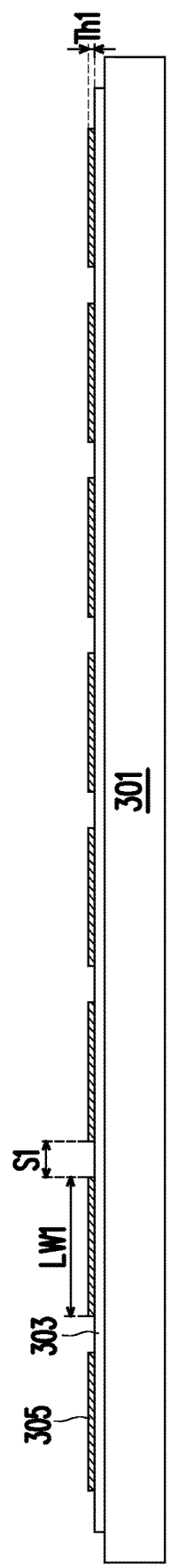
FIGS. 3 through 5 illustrate cross-sectional views of intermediate steps during a process for forming local organic interconnects of the system package, in accordance with some embodiments.

Referring to FIG. 3, this figure illustrates a cross-sectional view of forming a redistribution layer (RDL) over a first carrier substrate 301 in an intermediate stage of forming the local interconnects 107, according to some embodiments. The first carrier substrate 301 may be referred to herein as a support carrier, a support wafer, or a handling wafer and may be a carrier such as a glass carrier, a silicon carrier, a ceramic carrier, an organic carrier, or the like. According to some embodiments, the first carrier substrate 301 has a thickness of between about 2 mm and about 31 mm. However, any suitable thickness may be used.

FIG. 3 further illustrates the formation of a layer of the first isolation layers 303 using one or more suitable passivation materials (PM) such as a passivation material coating, polybenzoxazole (PBO), a polymer material, a polyimide material, a polyimide derivative, an oxide, a nitride, a molding compound, the like, or a combination thereof. The layer of the first isolation layers 303 may be formed by spin coating, lamination, CVD, the like, or a combination thereof. In some embodiments, the layer of the first isolation layers 303 may have a thickness of between about 0.5 µm and about 15 µm.

FIG. 3 further illustrates the formation of local redistribution traces 305 over the layer of the first isolation layers 303. According to some embodiments, the local redistribution traces 305 may include redistribution lines, micro-bump pad plating, combinations, or the like. The local redistribution traces 305 may also be referred to herein as local traces, local RDL traces, local RDL lines, local lines, conductive lines, conductive features. The local redistribution traces 305 may be formed by initially forming a metal seed layer over the layer of the first isolation layers 303. The seed layer may include an adhesion layer and a copper-containing layer in accordance with some embodiments. The adhesion layer may be formed of titanium, titanium nitride, tantalum, tantalum nitride, or the like. The copper-containing layer may be formed of substantially pure copper or a copper alloy. The metal seed layer may be formed using a Physical Vapor Deposition (PVD), a Plasma Enhanced Chemical Vapor Deposition (PECVD), an Atomic Layer Deposition (ALD), or the like. Once the metal seed layer has been formed, a plating mask (e.g., a photo resist) may be formed over the metal seed layer with openings patterned into the plating mask to expose some portions of the metal seed layer. Next, the local redistribution traces 305 are formed in openings of the plating mask, for example, using an electrochemical plating technique. The local redistribution traces 305 may be formed of copper, aluminum, nickel, palladium, alloys thereof, combinations, or the like. In some embodiments, portions of the local redistribution traces 305 are formed to a first thickness Th1 of between about 0.5 µm and about 10 µm. In some embodiments, the local redistribution traces 305 are formed to a first line width LW1 of between about 0.5 µm and about 10 µm. Furthermore, according to some embodiments, a spacing between the local redistribution traces 305 may be a first spacing S1 of between about 0.5 µm and about 10 µm. However, any suitable thicknesses, widths and spacing may be used to from the local redistribution traces 305.

After the local redistribution traces 305 have been formed, the plating mask is removed e.g., by ashing or a chemical stripping process, such as using oxygen plasma or the like, and the underlying portions of metal seed layer are exposed. Once the plating mask has been removed, the exposed portions of the metal seed layer are etched away.

Figure 4A:
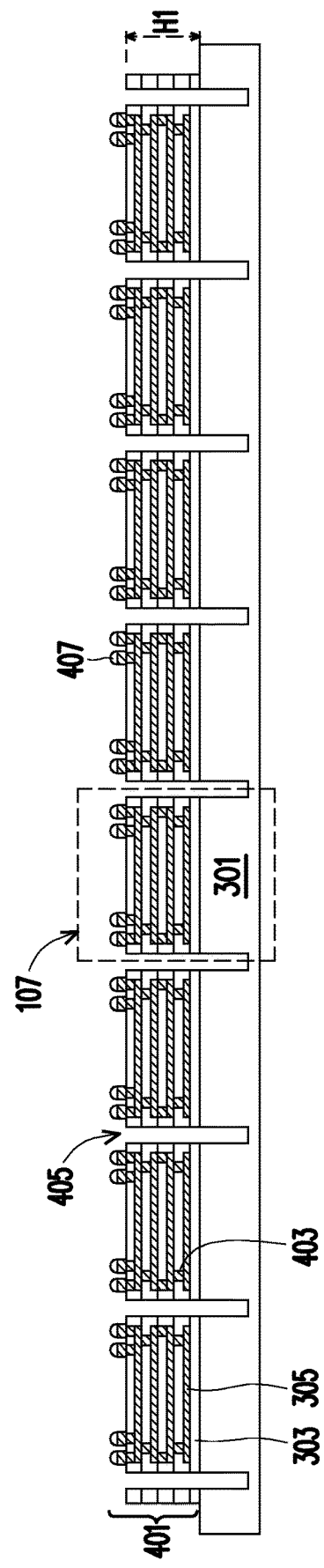

FIG. 4A illustrates a formation of a local redistribution layer stack 401 in an intermediate step of forming the local interconnects 107, according to some embodiments. According to some embodiments, the local redistribution layer stack 401 comprises a plurality of layers of the local redistribution traces 305, a plurality of layers of the first isolation layers 303, and a plurality of first conductive vias 403 connecting the local redistribution traces 305 to one another through the layers of the first isolation layer 303 by repeating the processes (as described further below with respect to FIG. 4B). The plurality of layers of the local redistribution traces 305 and the plurality of the first conductive vias 403 may be collectively referred to herein as local metallization layers, local metallization layer stack, local conductive layers, local conductive layer stack, local conductive redistribution layers, or local redistribution layers. The plurality of the first isolation layers 303 may be collectively referred to herein as a local interlayer passivation layer, a local interlayer isolation layer, a local interlayer dielectric layer, a local passivation layer stack, a local isolation layer stack, or a local dielectric layer stack. The local redistribution layer stack 401 may also be referred to herein as a local RDL stack, a local redistribution layer, or a local interconnect stack. According to some embodiments, the local redistribution layer stack 401 may have a first height H1 of between about 10 μm and about 100 μm. Once the local redistribution layer stack 401 has been formed, external component contacts 407 are formed for external connection to the local interconnects 107. The external component contacts 407 may be referred to herein as local interconnect contacts, local contacts, or external contacts.

Once formed, the local redistribution layer stack 401 may be singulated into discrete components of the local interconnects 107 using a suitable singulation process such as wafer saw, laser ablation, photolithographic and etching process, combinations, or the like. For example, singulation gaps 405 may be formed initially via laser ablation through the local redistribution layer stack 401 and into and/or through the first carrier substrate 301. After the laser ablation has been performed, a suitable etching process (e.g., wet etch) may be used to remove materials of the first carrier substrate 301 at the bottoms of the singulation gaps 405 to complete the singulation of the local interconnects 107. However, any suitable singulation process and/or combination of singulation processes may be used.

Figure 4B:
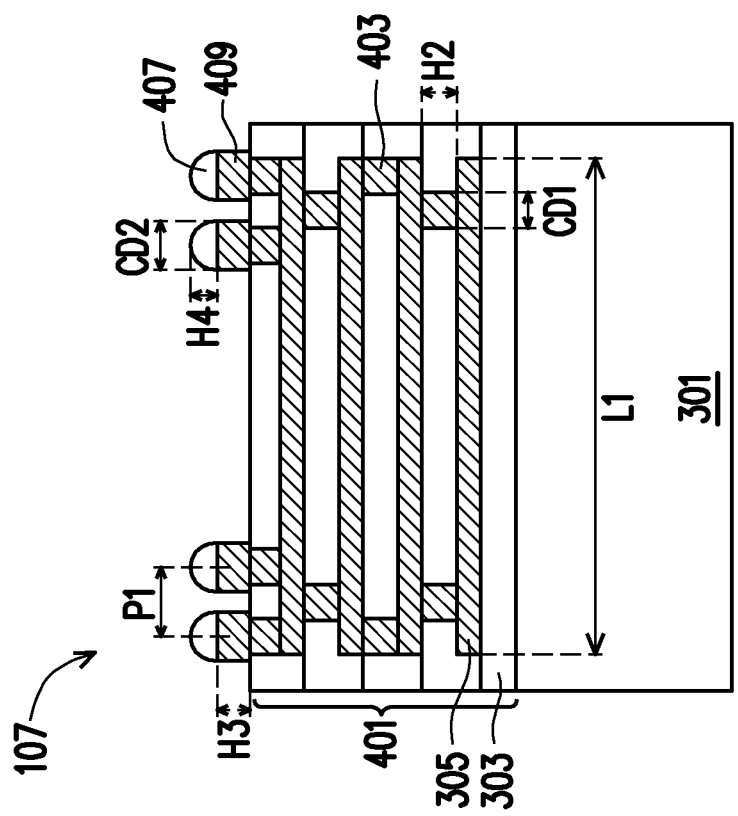

FIG. 4B illustrates one of the local interconnects 107 after singulation of the local redistribution layer stack 401, according to a particular embodiment. In particular, FIG. 4B illustrates the local interconnects 107 are formed with four layers of the local redistribution traces 305 separated from one another by layers of the first isolation layers 303 and electrically connected one to another by the first conductive vias 403. Although FIGS. 4A and 4B are illustrated with four layers, any suitable number of layers of the local redistribution traces 305 may be formed in the local redistribution layer stack 401 and, thus, the local interconnects 107.

Once a first layer of the local redistribution traces 305 has been formed, the first conductive vias 403 can be formed in desired locations over the first layer of the local redistribution traces 305 by initially forming another layer of the first isolation layers 303 over the local redistribution traces 305. Openings are then formed in the first isolation layers 303 to expose areas of the local redistribution traces 305 in desired locations of the first conductive vias 403. According to some embodiments, the openings are formed in the first isolation layers 303 using a suitable photolithographic (e.g., depositing and patterning a photoresist) to form a mask and etching the first isolation layers 303 using a suitable etching process (e.g., wet etch, dry etch, combinations, or the like). In embodiments which use a polymer material for the first isolation layers 303, an etch chemical (e.g., fluorocarbon ($CF_4$), hydrofluorocarbon ($CHF_3$), or the like) may be used for example in a reactive ion etching (RIE) process to form the openings in the first isolation layers 303.

Once the openings have been formed and the areas of the local redistribution traces 305 have been exposed, a seed layer may be formed through the openings, over the exposed areas, and over the layer of the first isolation layers 303. A photoresist may be formed and patterned on top of the seed layer in desired locations for the first conductive vias 403 and/or desired locations of an additional layer of the local redistribution traces 305 to be formed over the passivation material. Conductive material may then be formed in the patterned openings of the photoresist using, for example, a plating process to fill and/or overfill the openings in the passivation material and/or to form the additional layer of the local redistribution traces 305. The photoresist may then be removed by ashing and the exposed portions of the seed layer may be removed by etching. As such, the first conductive vias 403 are formed through the first isolation layers 303 and in connection with the underlying layer of the local redistribution traces 305 and/or the additional layer of the local redistribution traces 305 is formed over the first isolation layers 303 in connection with one or more of the first conductive vias 403. According to some embodiments, the first conductive vias 403 may have a first critical dimension CD1 of between about 2 μm and about 55 μm. Furthermore, the first conductive vias 403 may have a second height H2 of between about 0.5 μm and about 30 μm.

Further layers of the first isolation layers 303, first conductive vias 403, and further layers of the local redistribution traces 305 may be formed over one another until a desired topmost layer of the local redistribution layer stack 401 has been formed. Once the topmost layer has been formed, the external component contacts 407 and/or first under-bump metallizations (UBMs) 409 can be formed over the topmost layer for external connection to the local interconnects 107. In some embodiments, the first UBMs 409 are formed to extend through the topmost layer of the local redistribution layer stack 401 and form electrical connections with the first conductive vias 403 and/or the local redistribution traces 305. In such embodiments, the first UBMs 409 may be formed by, for example, forming openings in the first isolation layers 303 of the topmost layer of the local redistribution layer stack 401 and then forming the conductive material of the first UBMs 409 within the openings and over the first isolation layers 303. In some embodiments, the openings in the first isolation layers 303 may be formed by forming a photoresist over the topmost layer of the first isolation layers 303, patterning the photoresist, and etching the first isolation layers 303 through the patterned photoresist using a suitable etching process (e.g., a wet etching process and/or a dry etching process).

In some embodiments, the first UBMs 409 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the first UBMs 409. Any suitable materials or layers of material that may be used for the first UBMs 409 are fully intended to be included within the scope of the current application. The conductive materials of the first UBMs 409 may be formed using one or more plating processes, such as electroplating or electroless plating processes, although other processes of formation, such as sputtering, evaporation, or a PECVD process, may also be used. Once the conductive materials of the first UBMs 409 have been formed, portions of the conductive materials may then be removed through a suitable photolithographic mask and etching process to remove the undesired material. The remaining conductive material forms the first UBMs 409. In some embodiments, the first UBMs 409 may have a second critical dimension CD2 of between about 2 µm and about 55 µm. According to some embodiments, the first UBMs 409 may have a first pitch P1 of between about 20 µm and about 80 µm. Further still, in some embodiments, the first UBMs 409 may have a third height H3 of between about 2 µm and about 30 µm.

Still referring to FIG. 4B, the external component contacts 407 are formed over the first UBMs 409, in accordance with some embodiments. In some embodiments, the external component contacts 407 may be micro bumps (e.g., µbumps), ball grid array (BGA) connectors, solder balls, controlled collapse chip connection (C4) bumps, electroless nickel-electroless palladium-immersion gold technique (ENEPIG) formed bumps, or the like. The external component contacts 407 may include a conductive material such as copper, solder, aluminum, gold, nickel, silver, palladium, tin, the like, or a combination thereof. In some embodiments, the external component contacts 407 is formed by initially forming a layer of solder through evaporation, electroplating, printing, solder transfer, ball placement, or the like. Once a layer of solder has been formed on the external component contacts 407, a reflow may be performed in order to shape the material into the desired shapes. In embodiments in which the external component contacts 407 are formed as copper micro bumps, the external component contacts 407 may have a fourth height H4 of between about 2 µm and about 50 µm. In embodiments in which the external component contacts 407 are formed as solder micro bumps, the external component contacts 407 may have a fourth height H4 of between about 2 µm and about 30 µm. However, any suitable height may be used for the external component contacts 407. According to some embodiments, each of the local interconnects 107 comprises one or more of the local redistribution traces 305 and/or the first conductive vias 403 formed within the local interconnects 107 that electrically couple two or more of the external component contacts 407 to one another.

Figure 5:
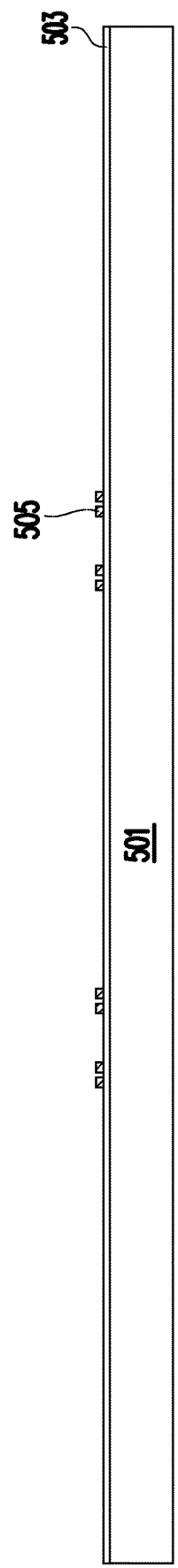

Turning to FIG. 5, this figure illustrates a cross-sectional view in an intermediate stage of forming the integrated substrate structure 111, according to some embodiments. According to some embodiments, a second carrier substrate 501 has a first release film 503 coating the top surface of the second carrier substrate 501. In some embodiments, the second carrier substrate 501 is formed of a transparent material, and may be a glass carrier, a ceramic carrier, an organic carrier, or the like. The first release film 503 may be formed of a Light-To-Heat-Conversion (LTHC) coating material applied to the second carrier substrate 501 in a coating process. Once applied, the LTHC coating material is capable of being decomposed under the heat of light/radiation (such as laser), and hence can release the second carrier substrate 501 from the structure formed thereon.

FIG. 5 further illustrates the formation of capture pads 505 (e.g., µbump capture pads) over the first release film 503. According to some embodiments, the capture pads 505 may comprise a seed layer, micro-bump pad plating, copper plating, solder plating, combinations, or the like. The capture pads 505 may be formed by initially forming a metal seed layer over the first release film 503. The seed layer may include an adhesion layer and a copper-containing layer in accordance with some embodiments. The adhesion layer may be formed of titanium, titanium nitride, tantalum, tantalum nitride, or the like. The copper-containing layer may be formed of substantially pure copper or a copper alloy. The metal seed layer may be formed using a Physical Vapor Deposition (PVD), a Plasma Enhance Chemical Vapor Deposition (PECVD), an Atomic Layer Deposition (ALD), or the like. Once the metal seed layer has been formed, a plating mask (e.g., a photo resist) may be formed over the metal seed layer with openings patterned into the plating mask to expose some portions of the metal seed layer. Next, the capture pads 505 are formed in openings of the plating mask, for example, using an electro-chemical plating technique. The capture pads 505 may be formed of copper, aluminum, nickel, palladium, alloys thereof, combinations, or the like. The capture pads 505 may be referred to herein as conductive pads, plated pads, bump pads, or pads.

After the capture pads 505 have been formed, the plating mask is removed e.g., by ashing or a chemical stripping process, such as using oxygen plasma or the like, and the underlying portions of the metal seed layer are exposed. Once the plating mask has been removed, the exposed portions of the metal seed layer are etched away.

Figure 6:
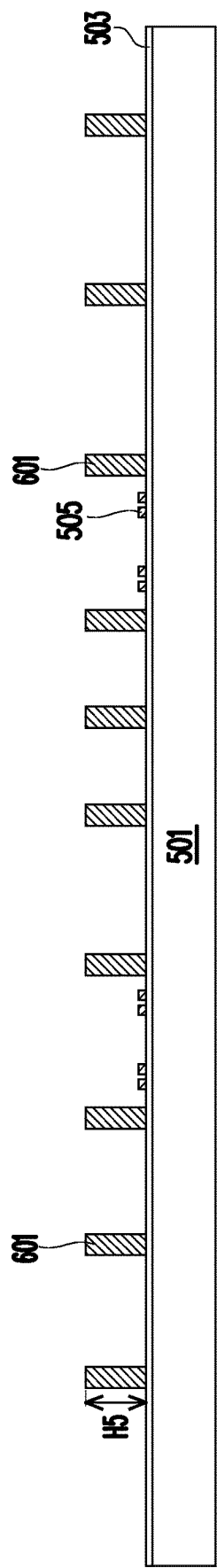
FIGS. 6 through 14 illustrate cross-sectional views of intermediate steps during a process for forming the integrated substrate structure using the local organic interconnects, in accordance with some embodiments.

Continuing to FIG. 6, first through-molding vias (TMVs) 601 are formed over the first release film 503, in accordance with some embodiments. The first TMVs 601 may be formed by initially forming a second seed layer (which may be similar to the metal seed layer) over the first release film 503 and the capture pads 505. Once the second seed layer has been formed, a second plating mask (e.g., photo resist) (not shown) is deposited over the second seed layer and, thus, over the first release film 503 and the capture pads 505. Once the second plating mask has been formed, it may be patterned to expose those portions of the first release film 503 that are located where the first TMVs 601 will subsequently be formed. In embodiments where the second plating mask is a photo resist, the patterning of the second plating mask may be done by exposing the photo resist in desired locations of the first TMVs 601 and developing the photo resist to either remove the exposed portions or the un-exposed portions of the photo resist. However, the second plating mask may be patterned using any suitable patterning process.

Once the second plating mask has been patterned, a conductive material may be formed on the first release film 503. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the first TMVs 601. Once the conductive material has been formed, the second plating mask may be removed through a suitable removal process such as an ashing process or a chemical stripping process, such as using oxygen plasma or the like and the underlying portions of the second seed layer are exposed. Once the second plating mask has been removed, the exposed portions of the second seed layer are etched away. In some embodiments, the first TMVs 601 may have a fifth height H5 that is between about 5 µm and about 100 µm. However, any suitable height may be used for the first TMVs 601.

Figure 7:
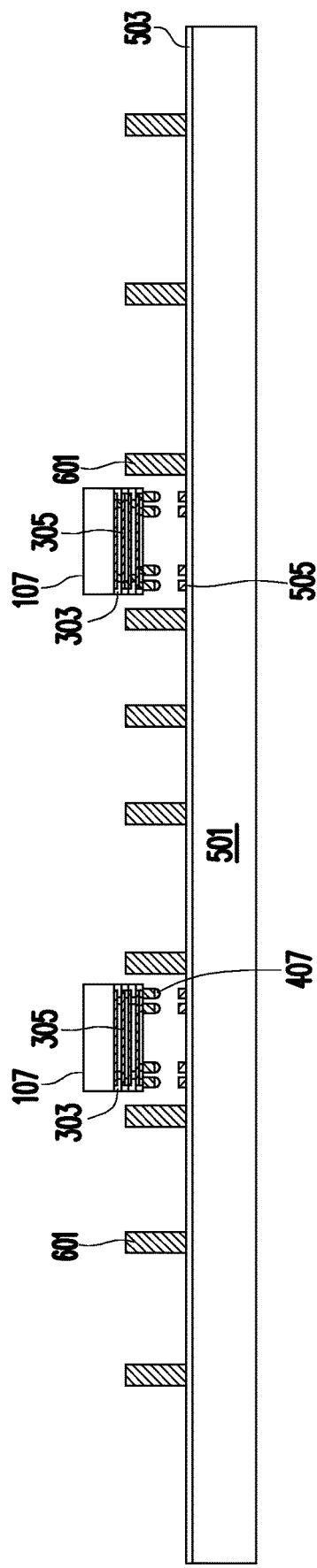

Turning to FIG. 7, this figure illustrates the placement and attachment of two of the local interconnects 107 to two sets of the capture pads 505, according to some embodiments. However, any suitable number of the capture pads 505 may be formed to the first release film 503 and any suitable number of the local interconnects 107 may be attached. In some embodiments, only one local interconnect 107 is attached and in other embodiments, more than two local interconnects 107 are attached. Furthermore, more than one type of the local interconnects 107 may be attached. For example, one or more of the local interconnects 107 that are attached may have more than or may have less than four of the local redistribution traces 305. As another example, one or more of the local interconnects 107 that are attached may comprise one or more integrated devices that are different from the integrated devices contained in the other attached ones of the local interconnect 107.

The local interconnects 107 may be placed on the second carrier substrate 501, for example, using e.g., a pick-and-place process. In some embodiments, once the solder material of the external component contacts 407 is in physical contact with the capture pads 505, a reflow process may be performed to bond the solder material of the external component contacts 407 to the capture pads 505 and thus attach the local interconnects 107 to the second carrier substrate 501.

However, while the above described process describes using a solder bonding technique in order to connect the local interconnects 107, this is intended to be illustrative and is not intended to be limiting. Rather, any suitable method of bonding, such as metal-to-metal bonding, hybrid bonding, fusion bonding, combinations of these, or the like, may be utilized to connect the local interconnects 107. All such methods are fully intended to be included within the scope of the embodiments.

Figure 8:
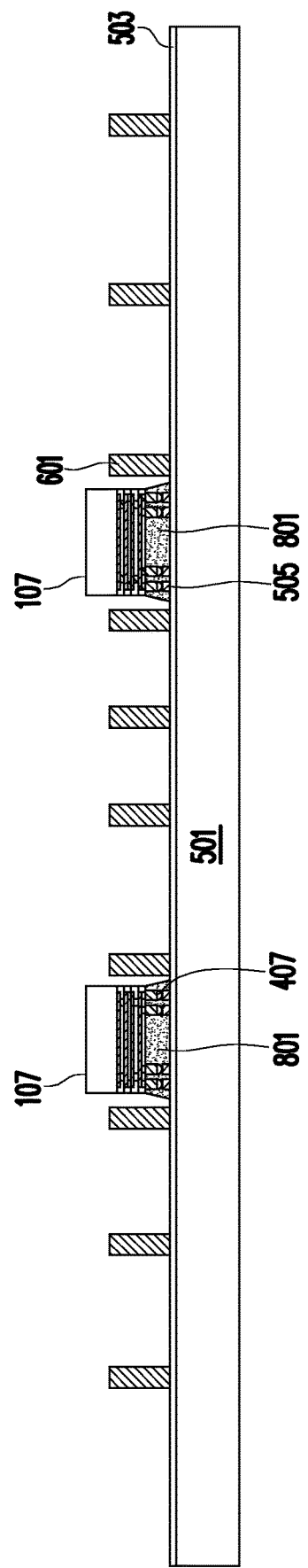

Turning to FIG. 8, once the local interconnects 107 have been attached, a first underfill 801 can be deposited in the gap between each of the local interconnects 107 and the first release film 503. The first underfill 801 may be a material such as an underfill material, a molding underfill (MUF), a molding compound, an epoxy, a resin, or the like. The first underfill 801 protects the external component contacts 407 and the first UBMs 409 and provides structural support for the local interconnects 107. In some embodiments, the first underfill 801 may be cured after deposition.

Figure 9:
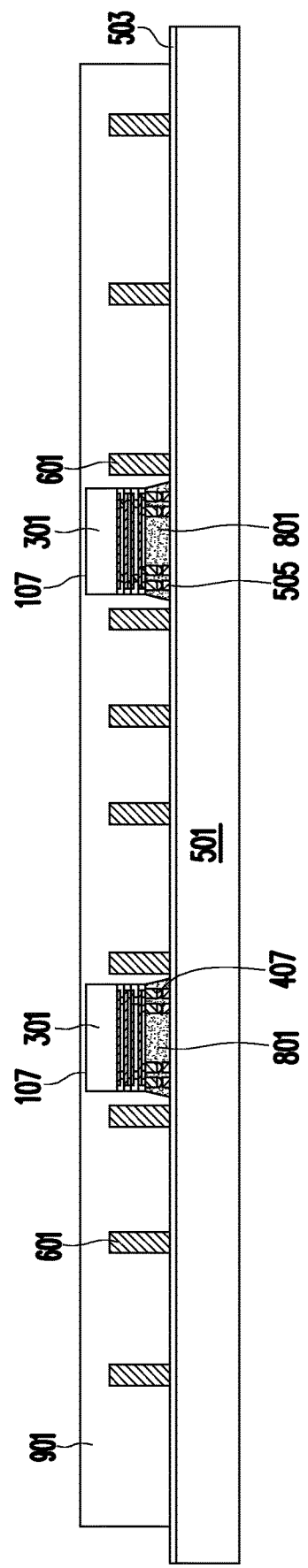

Continuing to FIG. 9, this figure illustrates an encapsulation of the local interconnects 107 and the first TMVs 601 using an encapsulant 901, in accordance with some embodiments. The encapsulation may be performed using a molding device or the encapsulant 901 may be deposited using another technique. The encapsulant 901 may be, for example, a molding compound such as epoxy molding compound (EMC), resin, polyimide, PPS, PEEK, PES, another material, the like, or a combination thereof. The encapsulant 901 may surround and/or cover the local interconnects 107 and the first TMVs 601.

Figure 10:
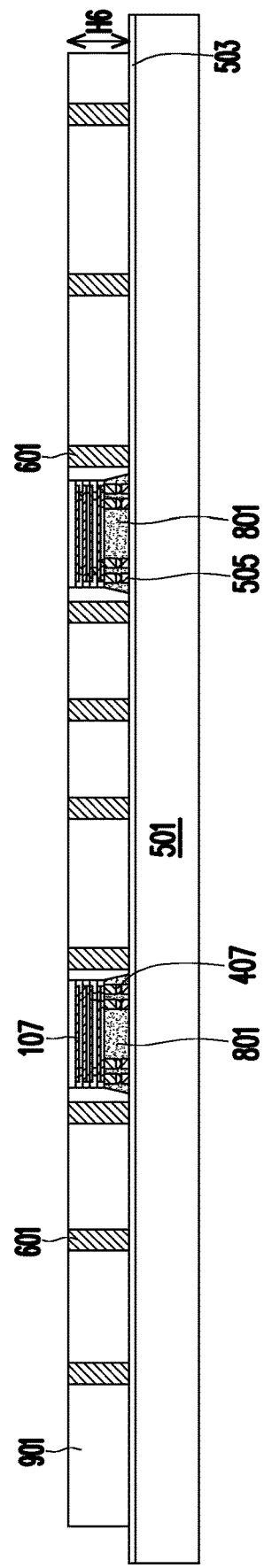

FIG. 10 illustrates a planarization process, according to some embodiments, performed on the intermediate structure illustrated in FIG. 9. The planarization process may be performed to remove excess materials from the encapsulant 901, the local interconnects 107, and/or the first TMVs 601 in accordance with some embodiments. The planarization process may be performed, e.g., using a mechanical grinding process, a chemical mechanical polishing (CMP) process, combinations, or the like. The planarization process removes excess portions of the encapsulant 901, excess materials of the first carrier substrate 301 from backsides of the local interconnects 107, and/or exposes the first TMVs 601. After the planarization process, a surface of the encapsulant 901 is coplanar with surfaces of the first TMVs 601 and/or the local interconnects 107 at a sixth height H6 of between about 5 µm and about 100 µm. However, any suitable height may be used. Furthermore in some embodiments, after the planarization process, one or more of the local redistribution traces 305 and/or the first conductive vias 403 within the local interconnects 107 may be exposed at the coplanar surface. In other embodiments, the first isolation layers 303 and/or remaining material of the first carrier substrate 301 at backsides of the local interconnects 107 is exposed at the coplanar surface.

Figure 11:
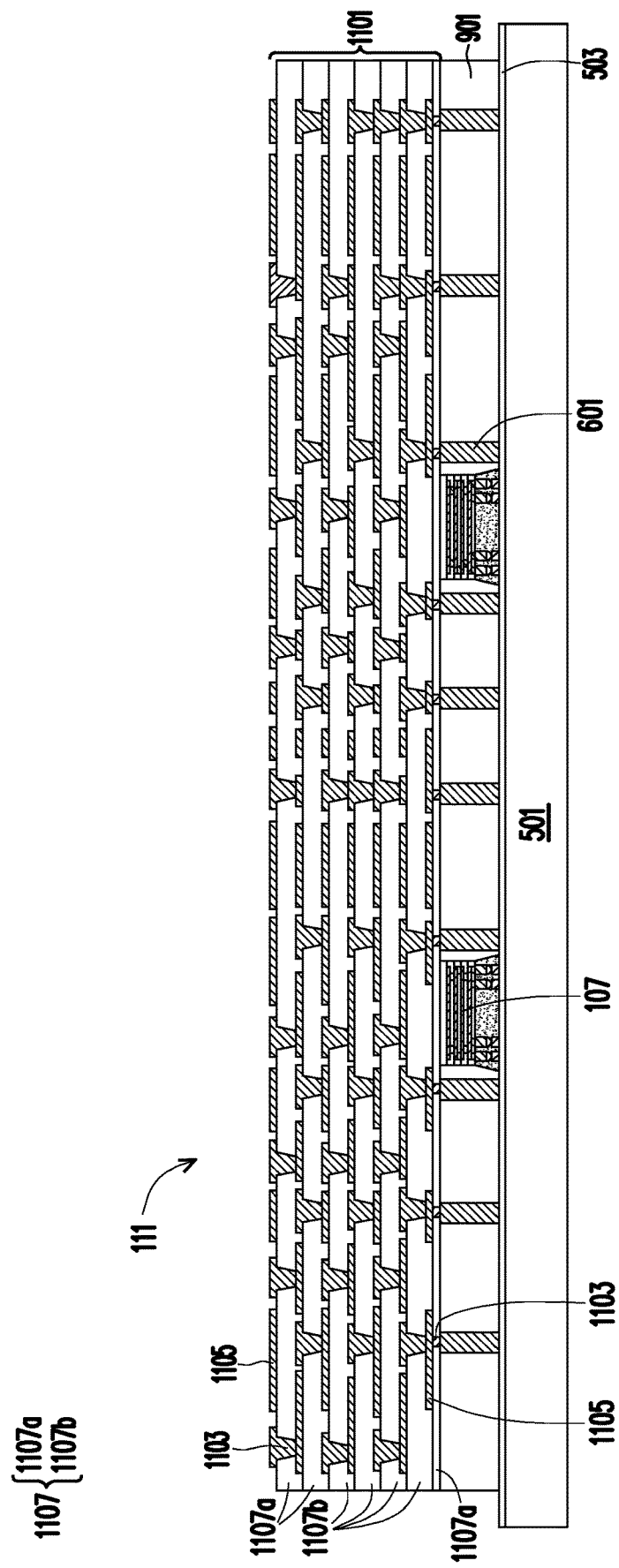

FIG. 11 illustrates a formation of a front side redistribution layer stack 1101 in an intermediate step of forming the integrated substrate structure 111, according to some embodiments. In some embodiments, the front side redistribution layer stack 1101 comprises a plurality of layers of front side redistribution traces 1105, second isolation layers 1107, and a plurality of second conductive vias 1103 connecting the front side redistribution traces 1105 to one another through the layers of the second isolation layers 1107. In the illustrated embodiment, the front side redistribution layer stack 1101 comprises seven layers of the front side redistribution traces 1105 separated by seven layers of the second isolation layers 1107 and comprises six layers of the second conductive vias 1103 connecting the front side redistribution traces 1105 through the second isolation layers 1107. However, the front side redistribution layer stack 1101 may comprise any suitable number of the front side redistribution traces 1105, the second isolation layers 1107, and the second conductive vias 1103. The front side redistribution traces 1105, the second isolation layers 1107, and the second conductive vias 1103 may be formed using any of the materials and processes suitable for forming the local redistribution traces 305, the first isolation layers 303, and the first conductive vias 403, as set forth above with regard to the local interconnects 107. Furthermore, the dielectric materials of the second isolation layers 1107 may all be the same dielectric material or they may be different dielectric materials. According to some embodiments, the front side redistribution traces 1105 may be referred to herein as front side redistribution lines, front side conductive traces, front side conductive lines, or front side lines.

In the embodiment illustrated in FIG. 11, three layers of the second isolation layers 1107 comprise a first dielectric material (e.g., (PBO)) (labeled 1107a) and four layers of the second isolation layers 1107 comprise a second dielectric material (e.g., molding compound) (labeled 1107b). However, any suitable combinations of dielectric materials and any suitable deposition processes may be used to form the second isolation layers 1107.

According to some embodiments, a first layer of the second isolation layers 1107 is formed over the coplanar surface of the encapsulant 901, the first TMVs 601, and/or the local interconnects 107 using the first dielectric material (e.g., (PBO)) and using a deposition process (e.g., spin-coating process). However, any suitable material and process may be used to form the first layer of the second isolation layers 1107. In some embodiments, the second isolation layers 1107 are formed using the same dielectric material as the first isolation layers 303. As such, a coefficient of thermal expansion of the second isolation layers 1107 may be about the same as a coefficient of thermal expansion of the local interconnects 107. In other embodiments, the second isolation layers 1107 are formed using different dielectric material (e.g., molding compound) from a dielectric material (e.g., PBO) used to form the first isolation layers 303. According to some embodiments, the second isolation layers 1107 may have a thickness of between about 5 µm and about 100 µm.

Openings may be made through the second isolation layers 1107 in desired locations of the second conductive vias 1103 using any of the processes (e.g., photolithographic mask and etching) that are suitable for forming the openings in the first isolation layers 303, as discussed above. However, any other suitable process (e.g., laser drilling) may also be used to form the openings in the second isolation layers 1107. Once the openings have been formed in the first layer of the second isolation layers 1107, contact areas of the first TMVs 601 and/or contact areas at backsides of the local interconnects 107 are exposed through the openings.

According to some embodiments, a first layer of the second conductive vias 1103 and/or a first layer of the front side redistribution traces 1105 may be formed by initially forming a third seed layer in the openings and over the first layer of the second isolation layers 1107. The third seed layer may be formed using any of the materials (e.g., copper, titanium, combinations, or the like) and deposition processes (e.g., PVD, CVD, combinations, or the like) used to form the second seed layer, as set forth above. Once the third seed layer has been formed, a third plating mask may be formed and patterned over the third seed layer using any of the materials (e.g., photo resist) and processes (e.g., exposing and developing the photo resist) suitable to form the second plating mask. The third plating mask is patterned to expose those portions of the third seed layer that are located where the first layer of the second conductive vias 1103 and/or the first layer of the front side redistribution traces 1105 will subsequently be formed. However, the third plating mask may be patterned using any suitable patterning process.

Once the third plating mask has been patterned, a conductive material may be formed in the openings and over exposed portions of the third seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the second conductive vias 1103 and the front side redistribution traces 1105. Once the first layer of the second conductive vias 1103 and/or the first layer of the front side redistribution traces 1105 have been formed, the third plating mask may be removed through any of the removal processes (e.g., ashing process) suitable for removing any of the plating masks, as set forth above.

Once the third plating mask has been removed, the exposed portions of the third metal seed layer are etched away leaving the first layer of the second conductive vias 1103 and/or the first layer of the front side redistribution traces 1105 in the desired locations through and/or over the first layer of the second isolation layers 1107. According to some embodiments, the second conductive vias 1103 may have a critical dimension of between about 5 μm and about 100 μm. However, any suitable dimension may be used for the second conductive vias 1103. In some embodiments, the front side redistribution traces 1105 may have a critical dimension of between about 1 μm and about 100 μm. However, any suitable dimension may be used for the front side redistribution traces 1105.

Once the first layers of the second conductive vias 1103 and/or the front side redistribution traces 1105 have been formed, further layers of the second isolation layers 1107, the second conductive vias 1103 and/or the front side redistribution traces 1105 may be formed over one another until a desired topmost layer of the front side redistribution layer stack 1101 has been formed. As such, the first TMVs 601 are electrically coupled to the topmost layer of the second conductive vias 1103 and/or the front side redistribution traces 1105 through the front side redistribution layer stack 1101. The topmost layer of the front side redistribution layer stack 1101 may be a layer of the second isolation layers 1107, a layer of the front side redistribution traces 1105, or a layer of the second conductive vias 1103. In the embodiment illustrated in FIG. 11, the topmost layer of the front side redistribution layer stack 1101 is a layer of the front side redistribution traces 1105 and two of the topmost layers of the second isolation layers 1107 are formed using the first dielectric material (e.g., (PBO)) (labeled 1107a).

Figure 12:
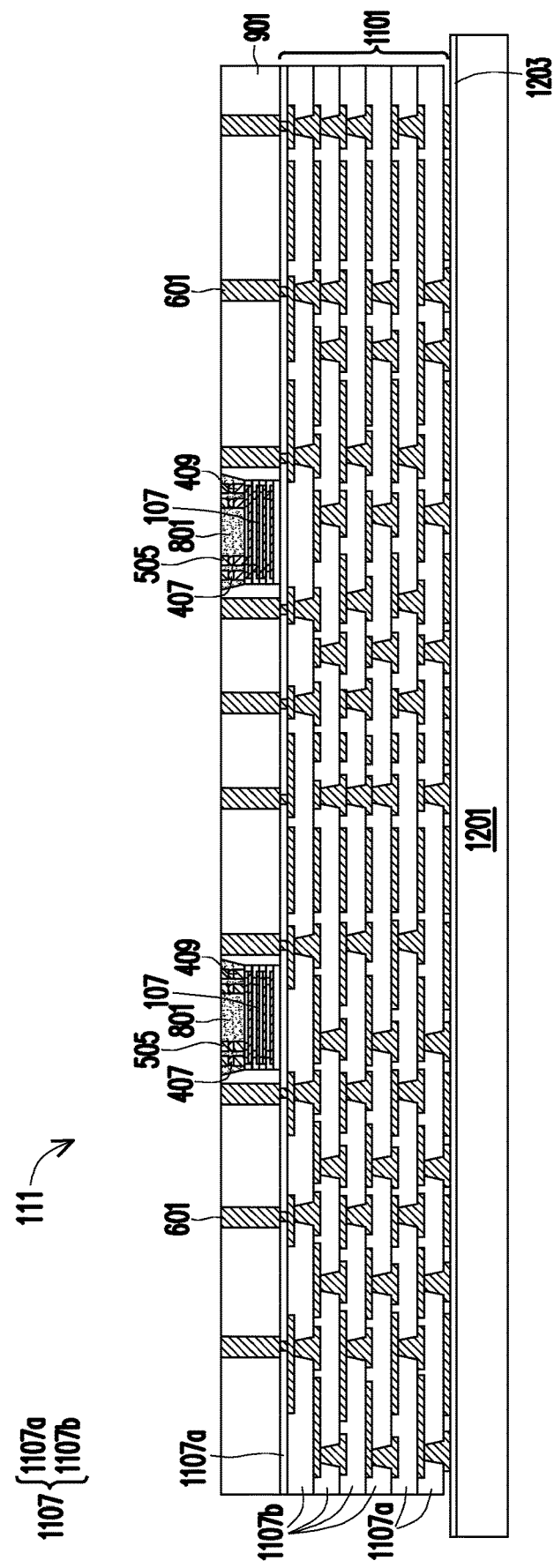

Turning to FIG. 12, this figure illustrates the de-bonding of the second carrier substrate 501 from the intermediate structure illustrated in FIG. 11 and attachment of the intermediate structure to a third carrier substrate 1201. According to some embodiments, the intermediate structure is flipped over and bonded to the third carrier substrate 1201 for further processing. Either before or after de-bonding of the second carrier substrate 501. The de-bonding includes projecting a light such as a laser light or an UV light on the first release film 503 over the second carrier substrate 501 so that the first release film 503 decomposes under the heat of the light and the second carrier substrate 501 can be removed. A second release film 1203 may be formed on the third carrier substrate 1201 to facilitate attachment of the front side redistribution layer stack 1101 to the third carrier substrate 1201. The third carrier substrate 1201 and the second release film 1203 may be similar to those described above for second carrier substrate 501 and the first release film 503.

Figure 13:
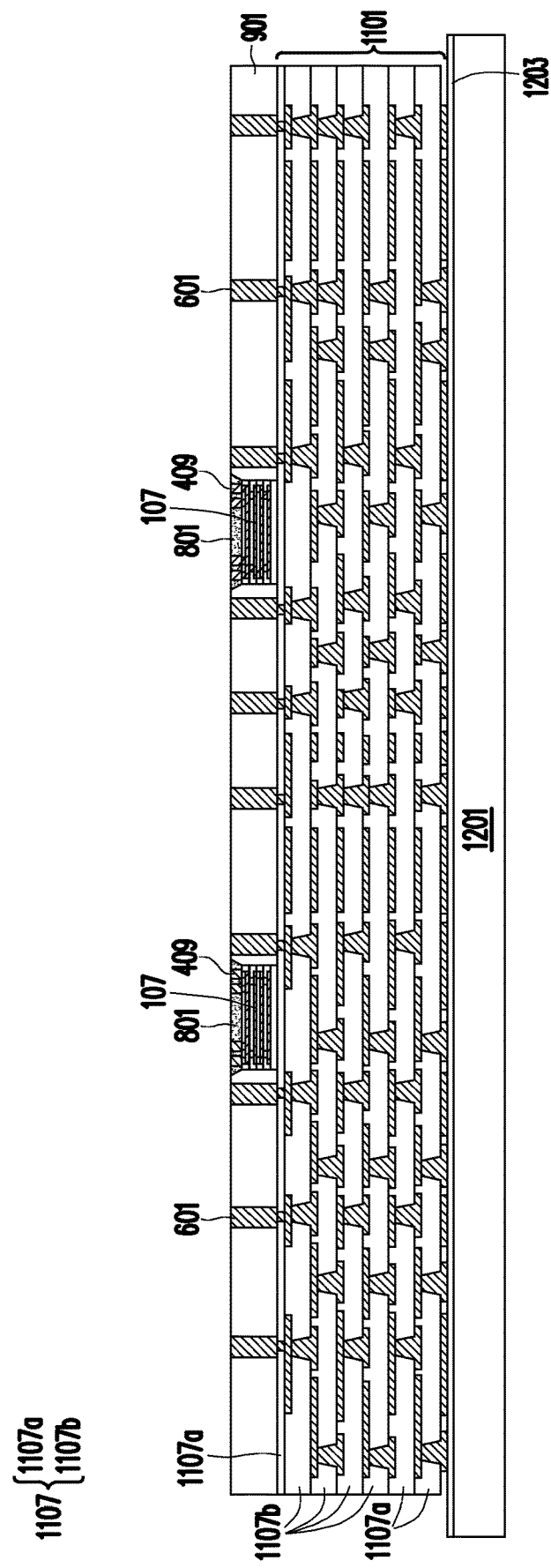

Continuing to FIG. 13, this figure illustrates a thinning process performed on the intermediate structure. The thinning process thins the intermediate structure by removing materials of the encapsulant 901, the first TMVs 601, the first underfill 801, the capture pads 505, the external component contacts 407, and/or the first UBMs 409. According to some embodiments, the capture pads 505 and the external component contacts 407 are removed by the thinning process and the encapsulant 901, the first TMVs 601, the first underfill 801, and the first UBMs 409 are planarized by the thinning process to form a coplanar surface at the front-side of the intermediate structure. The thinning process may be performed using one or more processes such as grinding, chemical mechanical planarization (CMP), wet etching, dry etching, combinations, or the like. In the embodiment illustrated in FIG. 13, the capture pads 505 and the external component contacts 407 are removed and the first UBMs 409 are exposed at the front-side of the intermediate structure.

Figure 14:
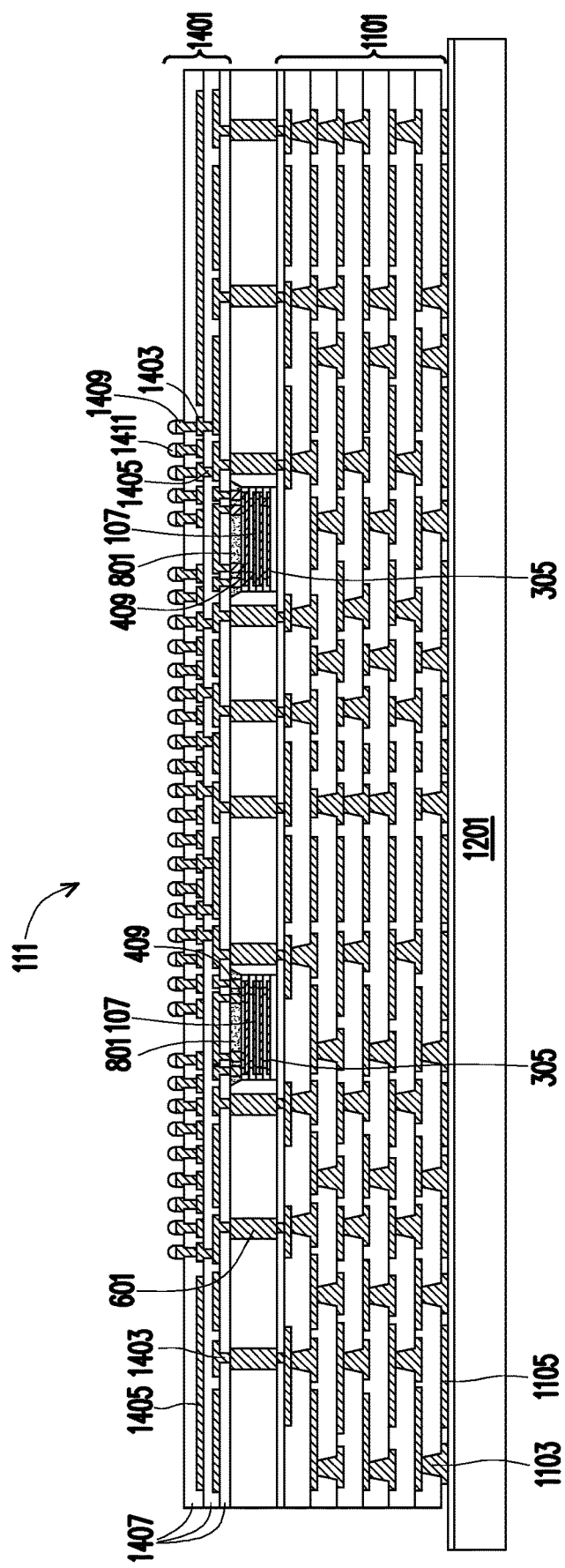

FIG. 14 illustrates the formation of a backside redistribution layer 1401 for external connection to the integrated substrate structure 111 in accordance with some embodiments. In some embodiments, the backside redistribution layer 1401 comprises a plurality of layers of backside redistribution traces 1405, third isolation layers 1407, and a plurality of third conductive vias 1403 connecting the backside redistribution traces 1405 to one another through the layers of the third isolation layers 1407. In the illustrated embodiment, the backside redistribution layer 1401 comprises two layers of the backside redistribution traces 1405 separated by three layers of the third isolation layers 1407 and comprises two layers of the third conductive vias 1403 connecting the backside redistribution traces 1405 through the third isolation layers 1407. However, the backside redistribution layer 1401 may comprise any suitable number of the backside redistribution traces 1405, the third isolation layers 1407, and the third conductive vias 1403. The backside redistribution traces 1405, the third isolation layers 1407, and the third conductive vias 1403 may be formed using any of the materials and processes suitable for forming the front side redistribution traces 1105, the second isolation layers 1107, and the second conductive vias 1103, as set forth above. According to some embodiments, the backside redistribution traces 1405 may be referred to herein as backside redistribution lines, backside conductive traces, backside traces, backside conductive lines, backside lines, backside metallization layers, conductive features, or conductive lines.

In the embodiment illustrated in FIG. 14, the third isolation layers 1407 may comprise, for example, the first dielectric material (e.g., (PBO)). According to some embodiments, the third isolation layers 1407 may have a thickness of between about 2 µm and about 50 µm. However, any suitable materials and any suitable deposition processes may be used to form the third isolation layers 1407.

According to some embodiments, a first layer of the third isolation layers 1407 is formed over the coplanar surface of the encapsulant 901, the first TMVs 601, the first underfill 801, the second UBMs 1409, using the first dielectric material (e.g., (PBO)) and using a deposition process (e.g., spin-coating process). However, any suitable material and process may be used to form the first layer of the third isolation layers 1407. In some embodiments, the third isolation layers 1407 are formed using the same dielectric material as the first isolation layers 303 of the local interconnects 107. As such, a coefficient of thermal expansion of the third isolation layers 1407 may be about the same as a coefficient of thermal expansion of the local interconnects 107. In other embodiments, the third isolation layers 1407 are formed using a second dielectric material (e.g., a polymer material) that is different from the first dielectric material (e.g., PBO) used to form the first isolation layers 303. According to some embodiments, the third isolation layers 1407 may have a thickness of between about 2 µm and about 50 µm.

Openings may be made through the third isolation layers 1407 in desired locations of the third conductive vias 1403 using any of the processes (e.g., photolithographic mask and etching) that are suitable for forming the openings in any of the isolation layers, as discussed above. However, any other suitable process may also be used to form the openings in the third isolation layers 1407. As such, the first TMVs 601 and contact areas (e.g., capture pads 505, external component contacts 407, or first UBMs 409) for external connection to the local interconnects 107 are exposed through the openings. In the illustrated embodiment, because the capture pads 505 and the external component contacts 407 have been removed in the thinning process discussed above, the first UBMs 409 of the local interconnects 107 are exposed through the openings.

According to some embodiments, a first layer of the third conductive vias 1403 and/or a first layer of the backside redistribution traces 1405 may be formed by initially forming a fourth seed layer in the openings and over the first layer of the third isolation layers 1407. The fourth seed layer may be formed using any of the materials (e.g., copper, titanium, combinations, or the like) and deposition processes (e.g., PVD, CVD, combinations, or the like) used to form any of the seed layers, as set forth above. Once the fourth seed layer has been formed, a fourth plating mask may be formed and patterned over the fourth seed layer using any of the materials (e.g., photo resist) and processes (e.g., exposing and developing the photo resist) suitable to form any of the plating masks discussed above. The fourth plating mask is patterned to expose those portions of the fourth seed layer that are located where the first layer of the third conductive vias 1403 and/or the first layer of the backside redistribution traces 1405 will subsequently be formed. However, the fourth plating mask may be patterned using any suitable patterning process.

Once the fourth plating mask has been patterned, a conductive material may be formed in the openings and over exposed portions of the fourth seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form the third conductive vias 1403 and the backside redistribution traces 1405. Once the first layer of the third conductive vias 1403 and/or the first layer of the backside redistribution traces 1405 have been formed, the fourth plating mask may be removed through any of the removal processes (e.g., ashing process) suitable for removing any of the plating masks, as set forth above.

Once the fourth plating mask has been removed, the exposed portions of the fourth seed layer are etched away leaving the first layer of the third conductive vias 1403 and/or the first layer of the backside redistribution traces 1405 in the desired locations through and/or over the first layer of the third isolation layers 1407. As such, the third conductive vias 1403 and/or the first layer of the backside redistribution traces 1405 are formed within the openings to the first TMVs 601 and the contact areas for external connection to the local interconnects 107. In the illustrated embodiment, because the capture pads 505 and the external component contacts 407 have been removed, the third conductive vias 1403 are formed directly to the first UBMs 409 of the local interconnects 107. As such, a low resistance contact bond is formed between the first UBMs 409 and the third conductive vias 1403. According to some embodiments, the third conductive vias 1403 may have a critical dimension of between about 2 µm and about 55 µm. However, any suitable dimension may be used for the third conductive vias 1403. In some embodiments, the backside redistribution traces 1405 may have a critical dimension of between about 0.5 µm and about 10 µm. However, any suitable dimension may be used for the backside redistribution traces 1405.

Once the first layer of the third conductive vias 1403 and/or the first layer of the backside redistribution traces 1405 have been formed, further layers of the third isolation layers 1407, the third conductive vias 1403 and/or the backside redistribution traces 1405 may be formed over one another until a desired topmost layer of the backside redistribution layer 1401 has been formed. The topmost layer of the backside redistribution layer 1401 may be a layer of the third isolation layers 1407, a layer of the backside redistribution traces 1405, or a layer of the third conductive vias 1403. In the embodiment illustrated in FIG. 14, the topmost layer of the backside redistribution layer 1401 is a layer of the backside redistribution traces 1405 and two of the topmost layers of the third isolation layers 1407 are formed using the first dielectric material (e.g., (PBO)).

Once the topmost layer of the third isolation layers 1407 has been formed, second under-bump metallizations (UBMs) 1409 and external device connectors 1411 are formed on the backside redistribution layer 1401, in accordance with some embodiments. The second UBMs 1409 extend through the topmost layer of the third isolation layers 1407 and form electrical connections with the third conductive vias 1403 and/or the backside redistribution traces 1405. In some embodiments, the second UBMs 1409 may be formed by, for example, forming openings in the topmost layer of the third isolation layers 1407 and then forming the conductive material of the second UBMs 1409 over the third isolation layers 1407 and within the openings in the third isolation layers 1407. In some embodiments, the openings in the third isolation layers 1407 may be formed by forming a photoresist over the third isolation layers 1407, patterning the photoresist, and etching the third isolation layers 1407 through the patterned photoresist using a suitable etching process (e.g., a wet etching process and/or a dry etching process).

In some embodiments, the second UBMs 1409 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the second UBMs 1409. Any suitable materials or layers of material that may be used for the second UBMs 1409 are fully intended to be included within the scope of the current application. The conductive materials of the second UBMs 1409 may be formed using one or more plating processes, such as electroplating or electroless plating processes, although other processes of formation, such as sputtering, evaporation, or a PECVD process, may also be used. Once the conductive materials of the second UBMs 1409 have been formed, portions of the conductive materials may then be removed through a suitable photolithographic masking and etching process to remove the undesired material. The remaining conductive material forms the second UBMs 1409.

Still referring to FIG. 14, the external device connectors 1411 are formed over the second UBMs 1409, in accordance with some embodiments. In some embodiments, the external device connectors 1411 may be a hybrid bump formation comprising any desired numbers and any desired combinations of ball grid array (BGA) connectors, solder balls, controlled collapse chip connection (C4) bumps, micro bumps (e.g., μbumps), electroless nickel-electroless palladium-immersion gold technique (ENEPIG) formed bumps, or the like. The external device connectors 1411 may include a conductive material such as solder, copper, aluminum, gold, nickel, silver, palladium, tin, the like, or a combination thereof. According to some embodiments, the 1411 may have a pitch of between about 20 μm and about 80 μm. In some embodiments, the external device connectors 1411 are formed by initially forming a layer of solder through evaporation, electroplating, printing, solder transfer, ball placement, or the like. Once a layer of solder has been formed on the external device connectors 1411, a reflow may be performed in order to shape the material into the desired shapes. As such, according to some embodiments, the local interconnects 107 electrically couple two or more of the external device connectors 1411 to one another. According to some embodiments, the first TMVs 601 electrically couple the external device connectors 1411 at one side of the integrated substrate structure 111 to the front side redistribution traces 1105 at the opposite side of the integrated substrate structure 111. In some embodiments, the backside redistribution layer 1401 and the first TMVs 601 electrically couple the local interconnects 107 to the front side redistribution traces 1105 at the opposite side of the integrated substrate structure 111.

Figure 15A:
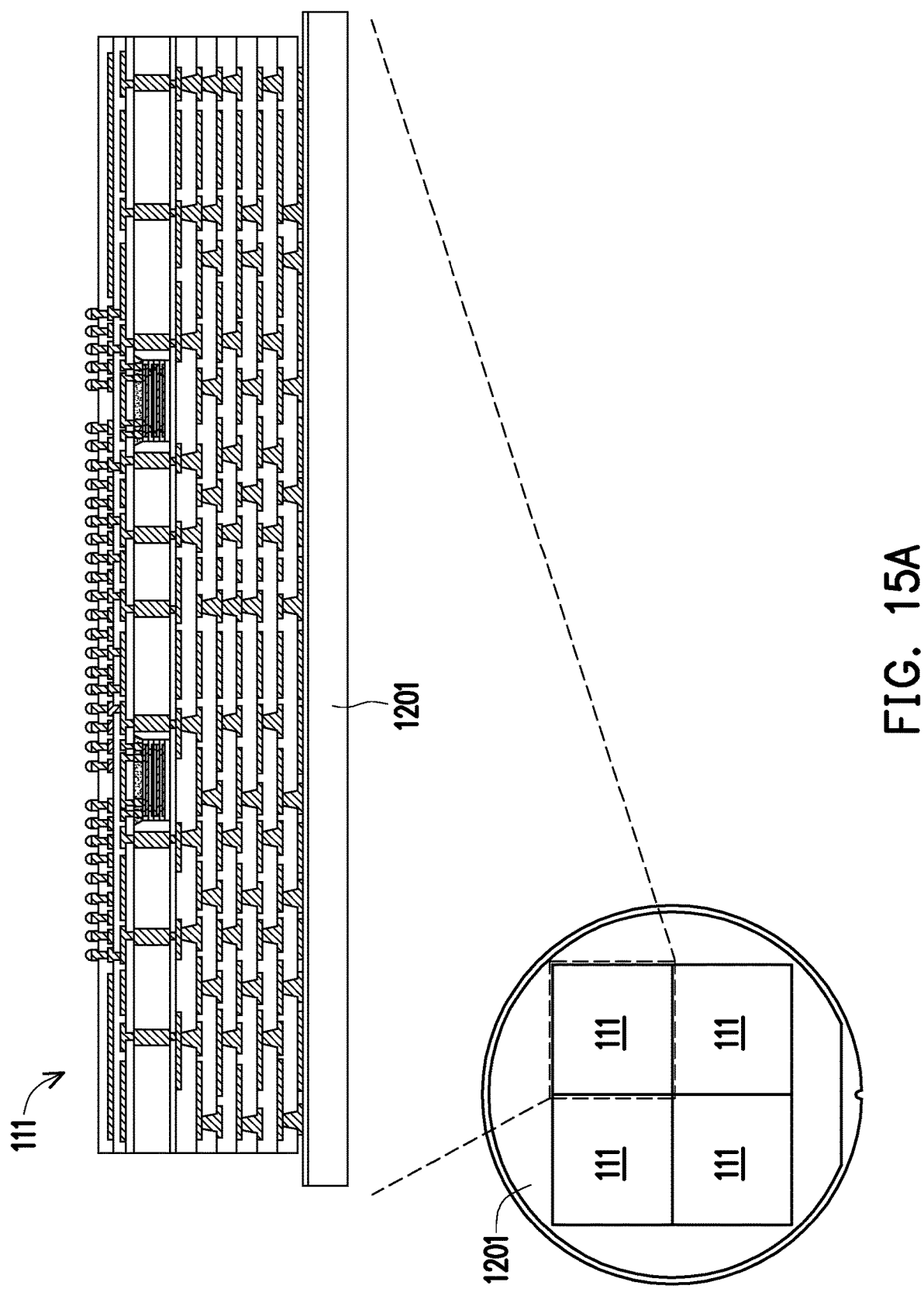
FIGS. 15A and 15B illustrate a wafer form process and a panel form process, respectively, for manufacturing of the integrated substrate structures according to some embodiments.

Turning to FIG. 15A, this figure illustrates a formation of the integrated substrate structure 111 in a wafer form process, according to some embodiments. In particular, FIG. 15A illustrates in a top down view that the wafer forming process may utilize a circular wafer 1501 to form a plurality of the integrated substrate structure 111. According to some embodiments, a plurality of the integrated substrate structure 111 may be formed using wafer level processing techniques. In the illustrated embodiment, four of the integrated substrate structures 111 are formed over the third carrier substrate 1201 in a single wafer and later singulated into the individual structures. Although an example of four of the integrated substrate structure 111 are shown formed in the single wafer in FIG. 15A, any suitable may be used.

Figure 15B:
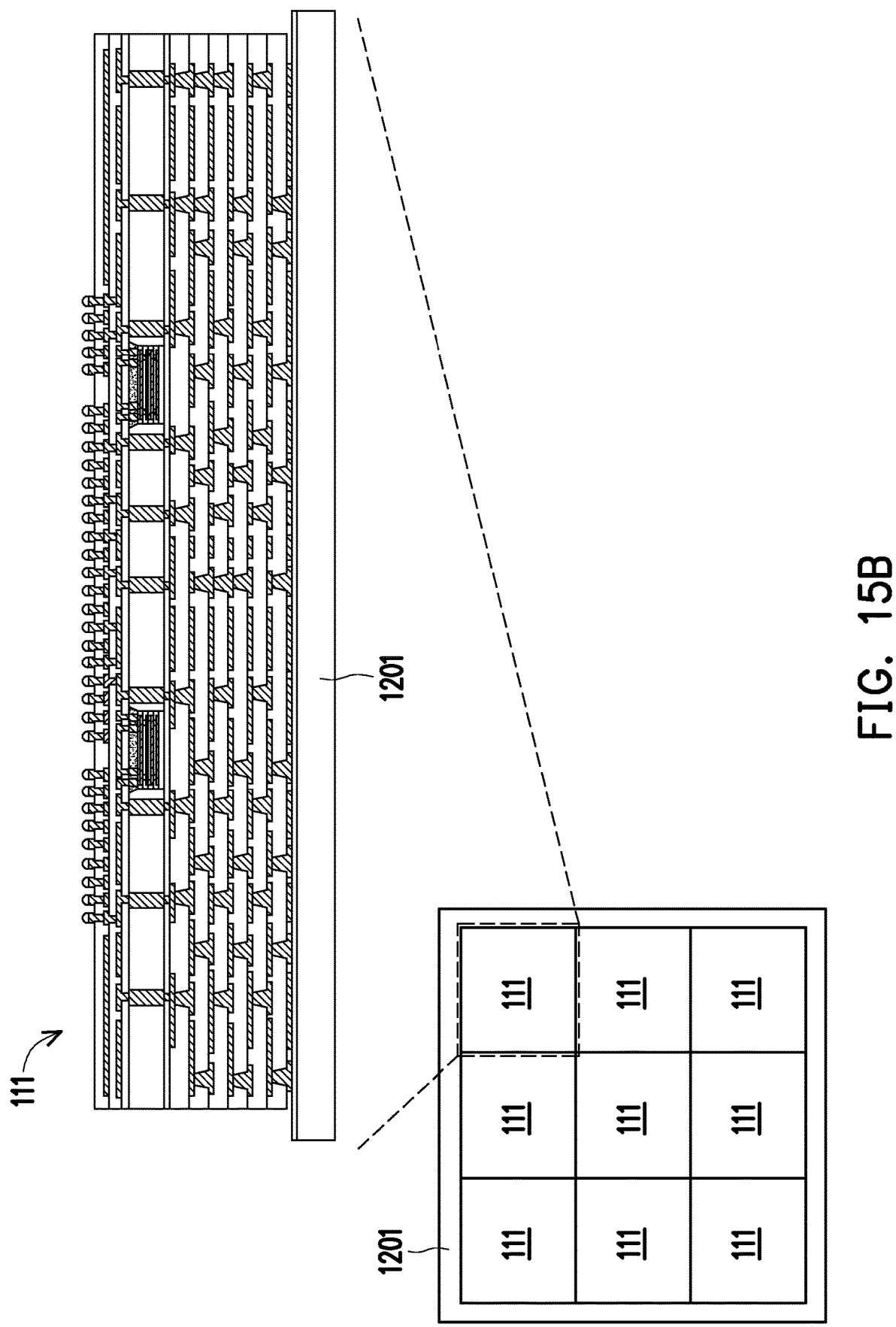

FIG. 15B shows an embodiment in which the third carrier substrate 1201 is a panel structure. According to some embodiments, a plurality of the integrated substrate structures 111 is formed on the third carrier substrate 1201. In some embodiments, nine of the integrated substrate structures 111 may be formed in the panel structure. Once formed, the panel structure may be further processed and subsequently singulated into individual structures of the integrated substrate structure 111. Once singulated, the integrated substrate structures 111 may be used in forming packaged devices. In the illustrated embodiment, the panel structure may be singulated into nine of the integrated substrate structures 111. However, any suitable number of integrated substrate structures 111 may be formed in the panel structure. In some embodiments, the integrated substrate structures 111 may remain in wafer or panel form during further processing (e.g., wafer to wafer bonding and/or wafer level packaging).

Figure 16:
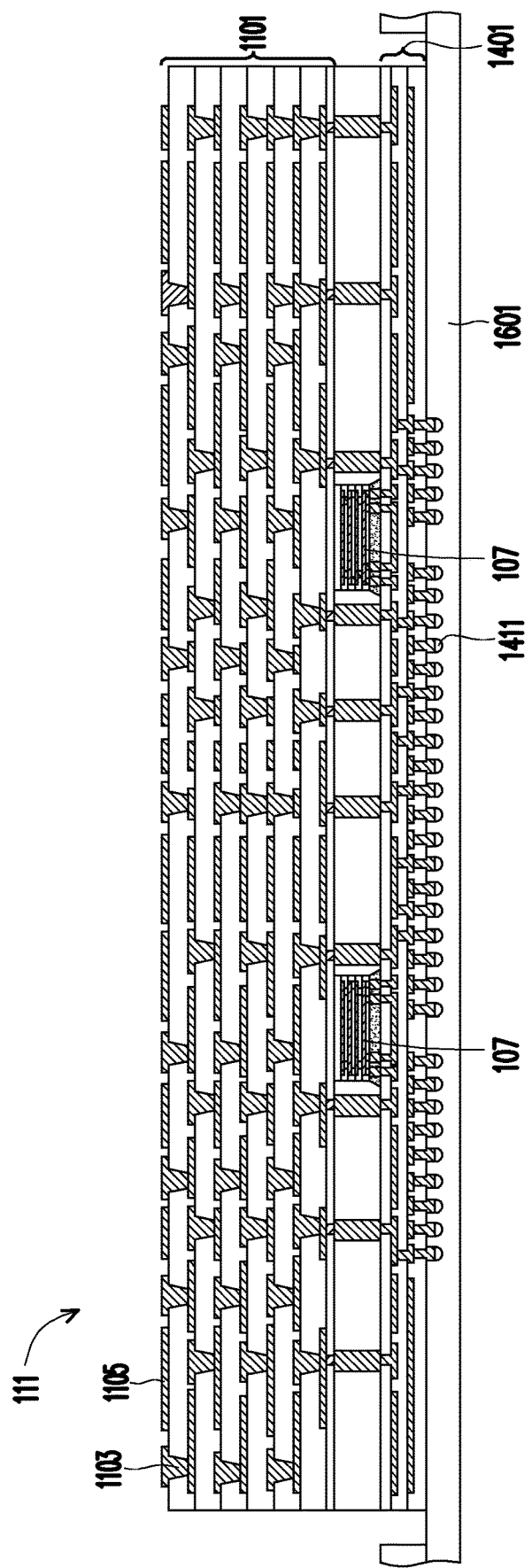
FIGS. 16 through 18 illustrate cross-sectional views of intermediate steps during a process for forming a device redistribution module using the integrated substrate structure, in accordance with some embodiments.

Continuing to FIG. 16, this figure illustrates the de-bonding of the third carrier substrate 1201 and attachment of the integrated substrate structures 111 to a carrier tape 1601 (e.g., a blue tape, UV film, or the like). According to some embodiments, the integrated substrate structure 111 is flipped over and bonded to the carrier tape 1601 either before or after de-bonding of the third carrier substrate 1201 for further processing. The third carrier substrate 1201 may be de-bonded similar to the processes used to remove any of the carrier substrates, as set forth above. For example, the third carrier substrate 1201 may be de-bonded by projecting a light on the second release film 1203 so that the second release film 1203 decomposes under the heat of the light and the third carrier substrate 1201 can be removed. The integrated substrate structure 111 may be flipped over and attached to the carrier tape 1601 either before or after de-bonding. The carrier tape 1601 provides both adhesion and protection for the attached surfaces of the backside redistribution layer 1401 and allows for further processing at the backside of the integrated substrate structure 111. In some embodiments, the wafer or panel of the integrated substrate structures 111 may be flipped over and bonded to the carrier tape 1601 for further processing.

Figure 17:
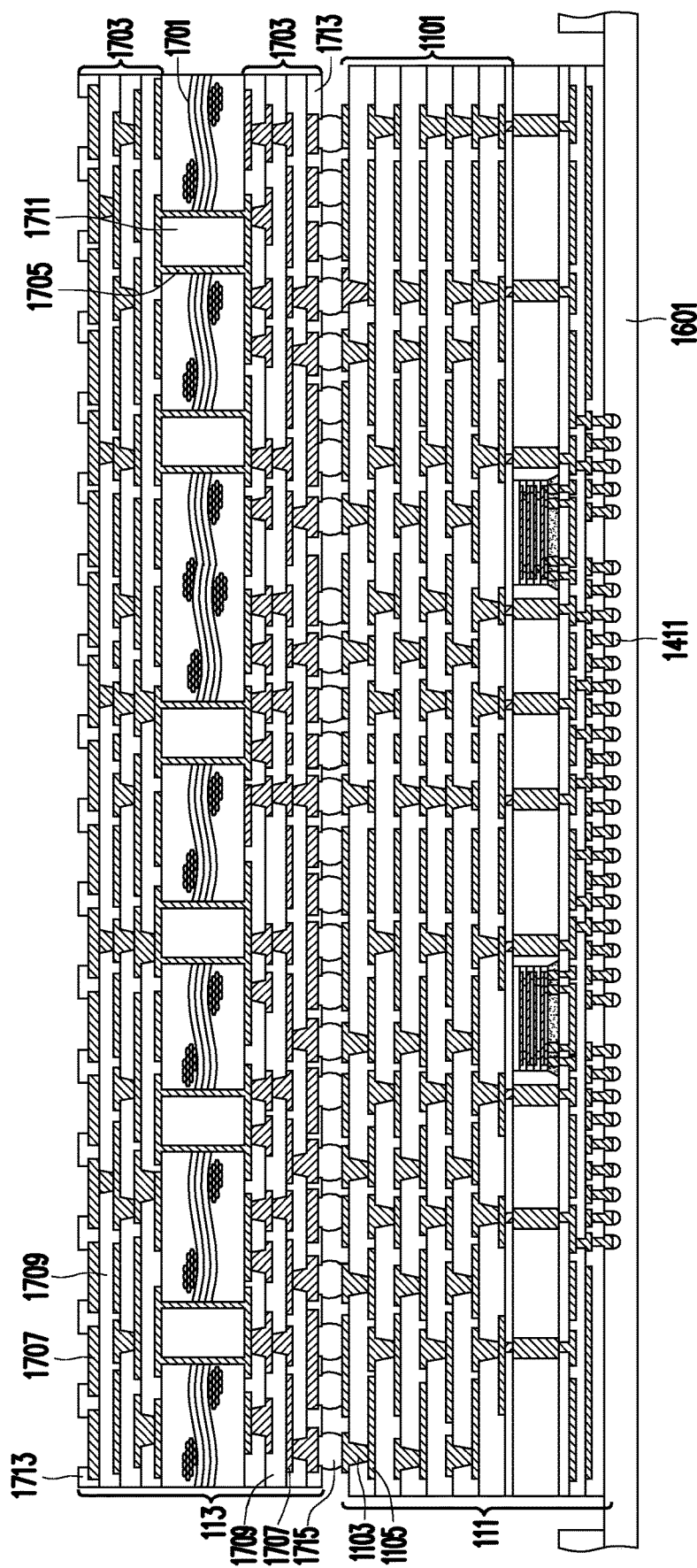

FIG. 17 illustrates the attachment of an interconnect structure 113 to the integrated substrate structure 111. The interconnect structure 113 provides additional routing and stability to the integrated substrate structure 111. For example, the interconnect structure 113 can reduce warping of the integrated substrate structure 111, especially for interconnect structures 113 having large areas (e.g., greater than about 70 mm²).

The interconnect structure 113, in accordance with some embodiments, may be, for example, an interposer or a "semi-finished substrate," and may be free of active devices. In some embodiments, the interconnect structure 113 includes routing layers formed on a core substrate 1701. The core substrate 1701 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 1701 may be a double-sided copper-clad laminate (CCL) substrate or the like. According to some embodiments, the core substrate 1701 may have a thickness between about 30 µm and about 2000 µm, such as about 500 µm or about 1200 µm.

The interconnect structure 113 may have one or more routing structures 1703 formed on each side of the core substrate 1701 and through vias 1705 extending through the core substrate 1701. The routing structures 1703 and through vias 1705 provide additional electrical routing and interconnection. The routing structures 1703 may include one or more routing layers 1707 and one or more interlayer dielectric layers 1709. In some embodiments, the routing layers 1707 and/or through vias 1705 may comprise one or more layers of copper, nickel, aluminum, other conductive materials, the like, or a combination thereof. In some embodiments, the interlayer dielectric layers 1709 may be include materials such as a build-up material, ABF, a prepreg material, a laminate material, another material similar to those described above for the core substrate 1701, the like, or combinations thereof. Although the illustrated embodiment of the interconnect structure 113 comprises two of the routing structures 1703 and each of the routing structures 1703 comprises four of the routing layers 1707, the routing structures 1703 may comprise more or fewer than four of the routing layers 1707. According to some embodiments, one of the routing structures 1703 may comprise more of the routing layers 1707 than the other one of the routing structures 1703.

In some embodiments, the through vias 1705 may comprise via cores 1711 surrounded by conductive material. The via core 1711 may be a filler material that provides structural support and protection for the conductive material of the through vias 1705. In some embodiments, the filler material may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material may include pigments or dyes (e.g., for color), or other fillers and additives that modify rheology, improve adhesion, or affect other properties of the via cores 1711. In some embodiments, the conductive material of the through vias 1705 may completely fill the through vias 1705, omitting the filler material.

In some embodiments, the interconnect structure 113 may include a passivation layer 1713 formed over one or more sides of the interconnect structure 113. The passivation layer 1713 may be a material such as a nitride, an oxide, a polyimide, a low-temp polyimide, a solder resist, combinations thereof, or the like. Once formed, the passivation layer 1713 may be patterned (e.g., using a suitable photolithographic and etching process) to expose portions of the routing layers 1707.

FIG. 17 further illustrates a placement of the interconnect structure 113 into electrical connection with the integrated substrate structure 111, in accordance with some embodiments. In an embodiment, the interconnect structure 113 is placed into physical contact with external structure connectors 1715 (e.g., reflowable bumps) that have been placed on the integrated substrate structure 111. The interconnect structure 113 may be placed using, e.g., a pick and place process. Once in physical contact, a reflow process may be utilized to bond the external structure connectors 1715 of the integrated substrate structure 111 to the interconnect structure 113. In some embodiments, the external structure connectors 1715 are formed on the interconnect structure 113 instead of or in addition to the external structure connectors 1715 being formed on the integrated substrate structure 111. In some embodiments, the external structure connectors 1715 are not formed on the integrated substrate structure 111, and the interconnect structure 113 is bonded to the integrated substrate structure 111 using a direct bonding technique such as a thermo-compression bonding technique. However, any suitable bonding technique may be used.

Once the integrated substrate structure 111 and the interconnect structure 113 have been bonded together by the external structure connectors 1715, the interconnect structure 113 provides extra routing for the integrated substrate structure 111. According to some embodiments, contact pads that face away from the integrated substrate structure 111 are electrically coupled through the interconnect structure 113 and the external structure connectors 1715 to the integrated substrate structure 111. Furthermore, one or more of the external device connectors 1411 that face the carrier tape 1601 may be electrically coupled through the integrated substrate structure 111 and the interconnect structure 113 to one or more of the contact pads that face away from the integrated substrate structure 111 in accordance with some embodiments.

In some embodiments, the interconnect structure 113 is attached to the wafer or panel of the integrated substrate structures 111, for example, in a reconstituted wafer process. In other embodiments, the interconnect structures 113 remain in wafer or panel form and are attached to the wafer or panel of the integrated substrate structures 111 in a wafer to wafer process.

Figure 18:
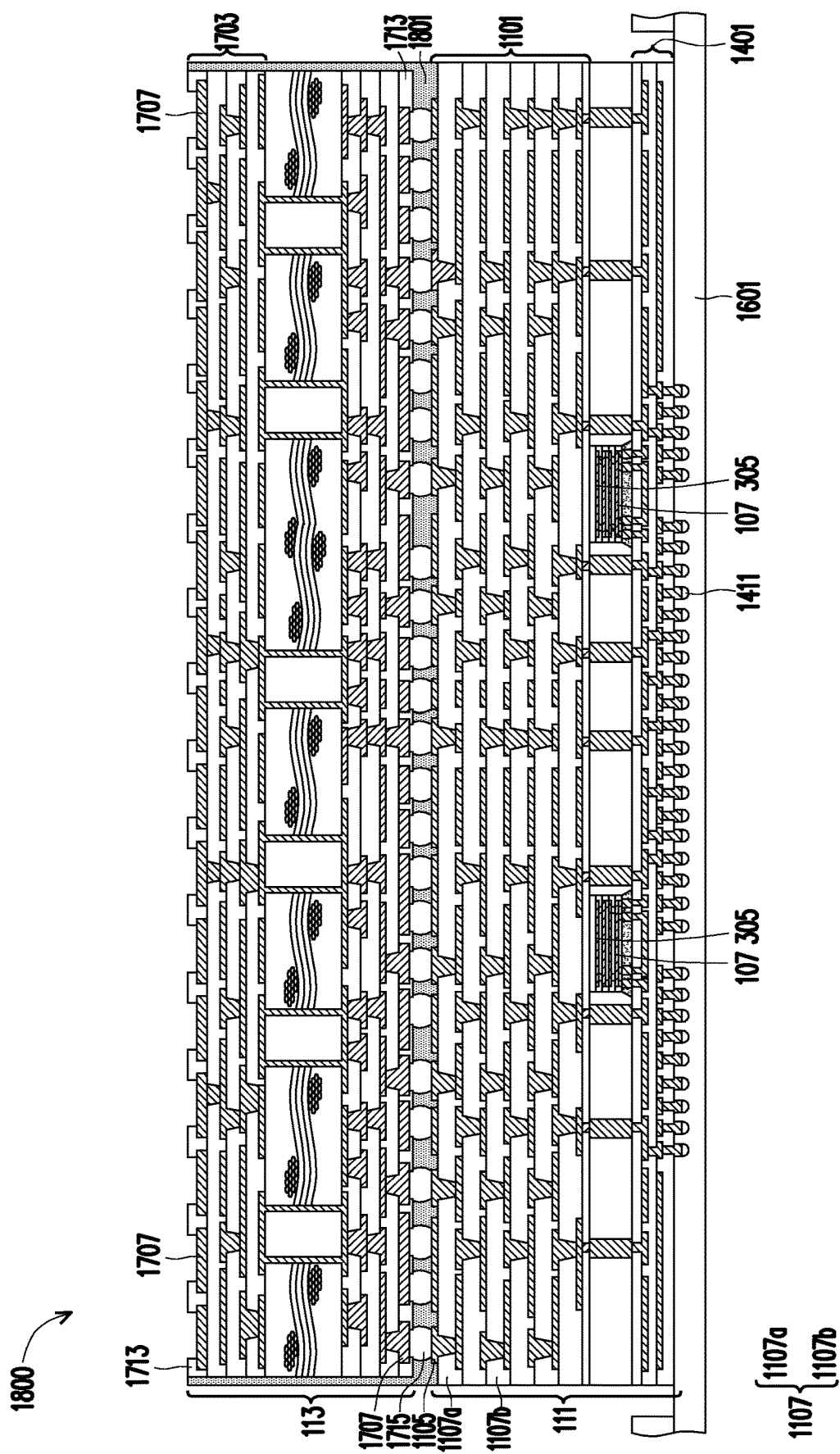

Turning to FIG. 18, this figure illustrates a formation of a device redistribution module 1800, according to some embodiments. Once the interconnect structure 113 has been attached, the device redistribution module 1800 may be formed by initially depositing a second underfill 1801 over the carrier tape 1601, along the sidewalls of the integrated substrate structure 111, along the sidewalls of the interconnect structure 113, and in the gap between the interconnect structure 113 and the integrated substrate structure 111. Examples of the second underfill 1801 include, but are not limited to, underfill materials such as an exposed molded underfill (eMUF), an underfill combined with an exposed molding compound, a dispensable molded underfill, molding compound, an epoxy, a resin, combinations, or the like. The second underfill 1801 can protect the external structure connectors 1715 and provide structural support for the integrated substrate structure 111. In some embodiments, the second underfill 1801 may be cured after deposition and/or may be thinned after deposition. The thinning may be performed, e.g., using a mechanical grinding or CMP process. In some embodiments, the second underfill 1801 may be deposited over the routing structures 1703 facing away from the integrated substrate structure 111, the thinning may expose the topmost layer of the passivation layer 1713 facing away from the integrated substrate structure 111, and an etching process in order to expose the routing layers 1707.

In embodiments in which the interconnect structures 113 are attached to the integrated substrate structures 111 when the integrated substrate structures 111 are part of a wafer or panel, the second underfill 1801 may be formed prior to singulation of the structures into a plurality of the device redistribution modules 1800, resulting in the second underfill 1801 being planar with the integrated substrate structures 111. In embodiments in which the interconnect structures 113 remain in wafer or panel form and are attached to the wafer or panel of the integrated substrate structures 111 in a wafer to wafer process, the device redistribution module 1800 may be formed by initially singulating the structure into discrete components and forming the second underfill 1801 over one or both of the discrete components. Any suitable combination of steps may be utilized.

Figure 19:
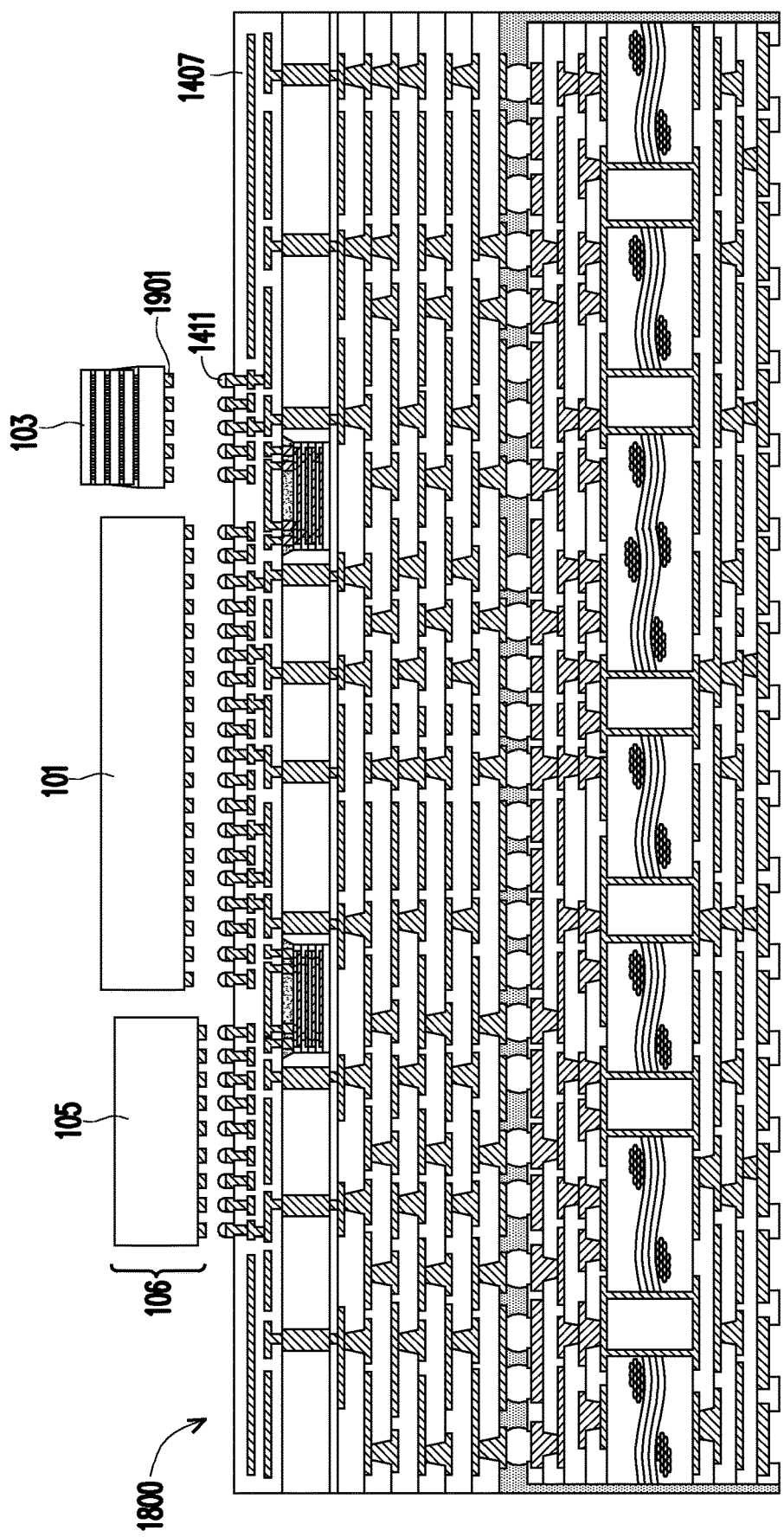
FIGS. 19 and 20 illustrate cross-sectional views of mounting semiconductor devices and attaching external package connectors in intermediate steps of forming the system package, in accordance with some embodiments.

FIG. 19 illustrates a singulation and de-mounting of the device redistribution module 1800 from the carrier tape 1601 and further illustrates placement of a plurality of the semiconductor devices 106 over the device redistribution module 1800, in accordance with some embodiments. Once removed from the carrier tape 1601, the structure may be flipped over and singulated (e.g., via wafer sawing, laser drilling, etching, combinations, or the like) into a plurality of the device redistribution modules 1800.

In some embodiments, the semiconductor devices 106 are placed via a pick and place process over the external device connectors 1411. The semiconductor devices 106 may be placed after singulation of the device redistribution module 1800 from the wafer. However, in other embodiments, the semiconductor devices 106 may also be placed and then attached prior to singulation of the wafer.

Figure 20:
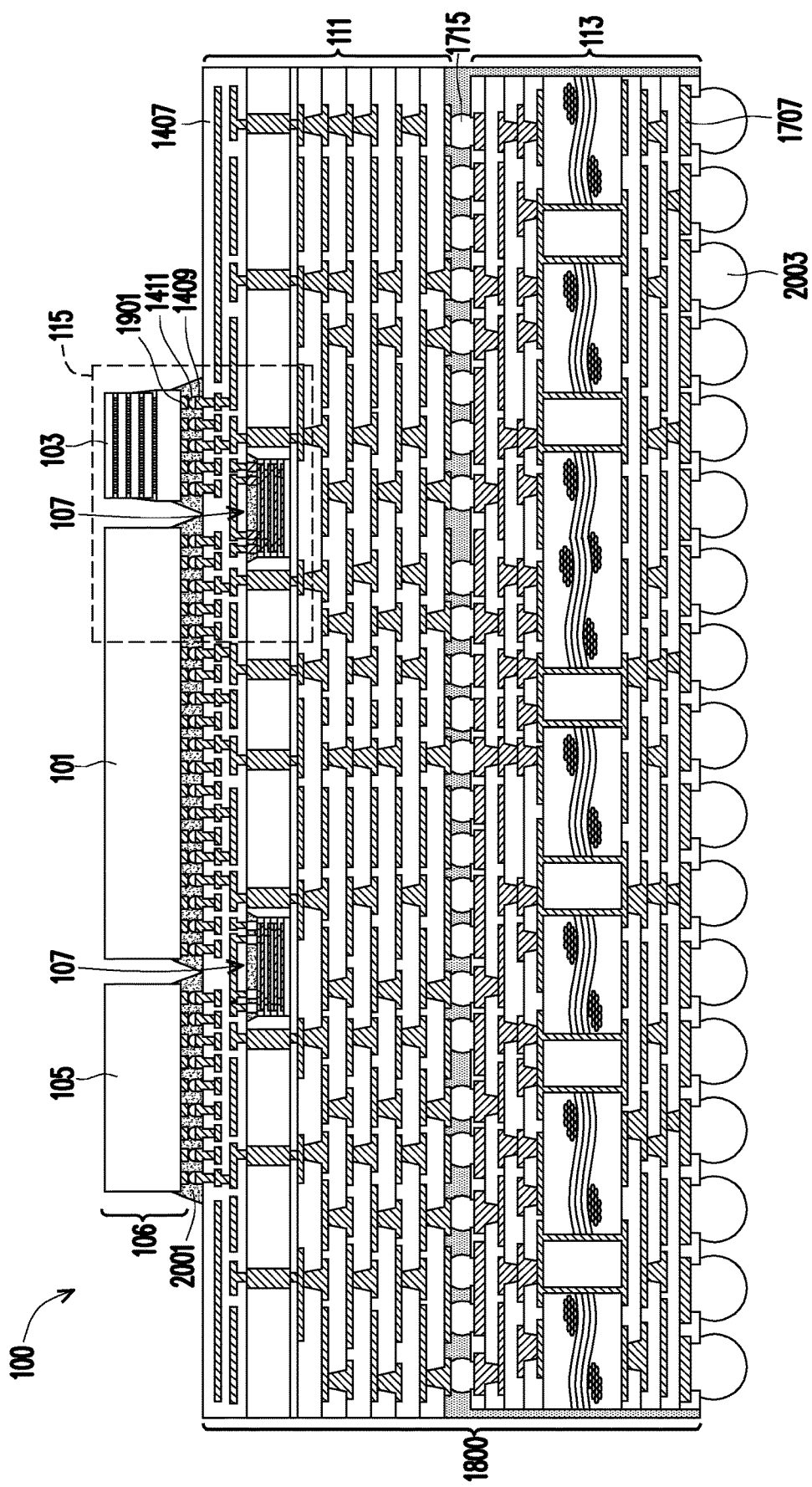

FIG. 20 illustrates bonding of the semiconductor devices 106, a formation of a third underfill 2001, and attachment of external package connectors 2003 of the system package 100, in accordance with some embodiments. The semiconductor devices 106 may be placed such that external contacts 1901 (e.g., contact pads, conductive connectors, solder bumps, or the like) of the semiconductor devices 106 are aligned with corresponding ones of the external device connectors 1411. Once in physical contact, a reflow process may be utilized to bond the external contacts 1901 of the semiconductor devices 106 to the device redistribution module 1800. In some embodiments, the external device connectors 1411 are formed on the external contacts 1901 of the semiconductor devices 106 instead of or in addition to the external device connectors 1411 being formed on the second UBMs 1409 of the integrated substrate structure 111.

In some embodiments, the external device connectors 1411 are not formed on the integrated substrate structure 111, and the semiconductor devices 106 are bonded to the integrated substrate structure 111 using a direct bonding technique such as a thermo-compression bonding technique. However, any suitable bonding technique may be used. FIG. 20 further illustrates the section 115 highlighting the arrangement between two of the semiconductor devices 106 electrically coupled to one another by one of the local interconnects 107.

Once bonded, a third underfill 2001 may be deposited between each of the semiconductor devices 106 and the topmost layer of the third isolation layers 1407 according to some embodiments. The third underfill 2001 may also at least partially surround the external device connectors 1411 and/or second UBMs 1409. The third underfill 2001 may be a material such as a molding compound, an epoxy, an underfill, a molding underfill (MUF), a resin, or the like, and may be similar to any of the other underfills described above. In some cases, the semiconductor devices 106 are at least partially connected to each other by the local interconnects 107.

Once the third underfill 2001 has been formed, in embodiments where the semiconductor devices 106 are attached prior to singulation, the wafer may be singulated. In some embodiments, the wafer may be singulated into a plurality of the system packages 100 prior to forming the external package connectors 2003, although the wafer may also be singulated after forming the external package connectors 2003.

Once the third underfill 2001 has been formed, the external package connectors 2003 may be formed at the backside of the system package 100. The external package connectors 2003 may be formed on exposed portions of the topmost layer of the routing layers 1707 facing away from the integrated substrate structure 111. These exposed portions of the topmost layer may be referred to herein as external contact pads of the interconnect structure 113. In some embodiments, UBMs are formed on external contact pads of the interconnect structure 113, and the external package connectors 2003 are formed over the UBMs. The external package connectors 2003 may be, for example, contact bumps or solder balls, although any suitable types of connectors may be utilized. In an embodiment in which the external package connectors 2003 are contact bumps, the external package connectors 2003 may include a material such as tin, or other suitable materials, such as silver, lead-free tin, or copper. In an embodiment in which the external package connectors 2003 are solder bumps, the external package connectors 2003 may be formed by initially forming a layer of solder in desired locations of the external package connectors 2003 using such a technique such as evaporation, electroplating, printing, solder transfer, ball placement, etc. Once the layer of solder has been formed in the desired locations, a reflow may be performed in order to shape the material into the desired bump shape for the external package connectors 2003. In some embodiments, the external package connectors 2003 may be similar to the external structure connectors 1715 described above and/or the external device connectors 1411.

Figure 21:
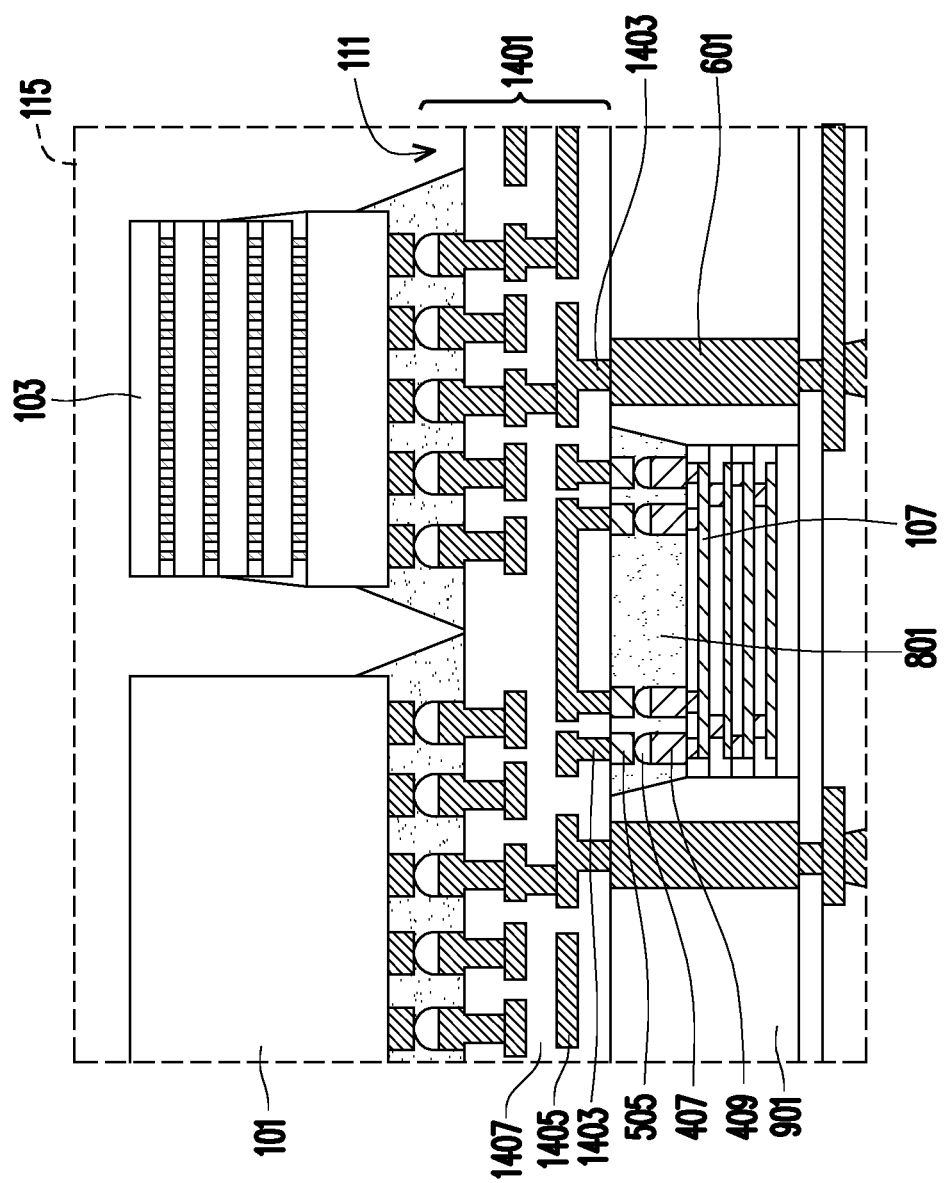
FIG. 21 illustrates a cross-sectional view of a section of the system package using the local organic interconnect, according to another embodiment.

FIG. 21 illustrates another method for forming the integrated substrate structure 111, according to another embodiment. In particular FIG. 21 illustrates a magnified view of the section 115 of the system package 100 using the integrated substrate structure 111 formed according to this embodiment, wherein the section 115 of FIG. 21 corresponds to the section 115 highlighted in FIG. 20.

In this embodiment of forming the integrated substrate structure 111, the thinning process used to remove the capture pads 505 and the external component contacts 407 (as discussed above with regard to FIG. 13) is omitted. As such, in this embodiment method of forming the integrated substrate structure 111, the first layer of the third isolation layers 1407 is formed over the capture pads 505 in addition to being formed over the first underfill 801, the first TMVs 601, and the encapsulant 901. Furthermore, the third conductive vias 1403 of the backside redistribution layer 1401 are formed over and electrically coupled to the capture pads 505 in addition to being formed over the first TMVs 601. As such, the local interconnects 107 are electrically coupled to the backside redistribution layer 1401 by the external component contacts 407 (e.g., solder joints) bonded between the capture pads 505 and the first UBMs 409 according to the optional method.

Figure 22:
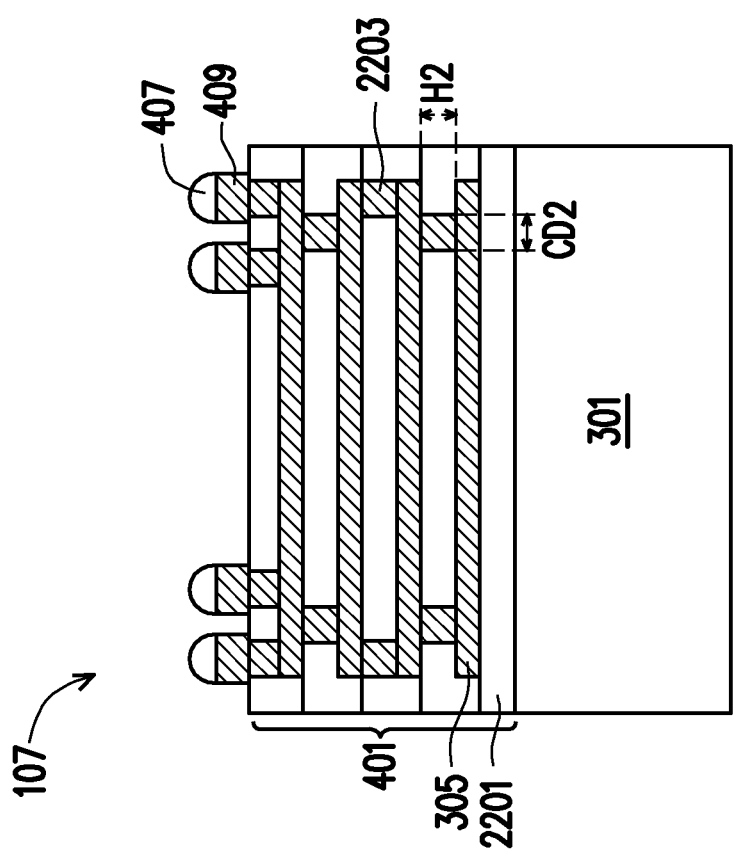
FIG. 22 illustrates a cross-sectional view of the local organic interconnect, according to another embodiment.

Turning to FIG. 22, this figure illustrates the local interconnect 107 in accordance with other embodiments. The local interconnect 107 illustrated in FIG. 22 is similar to the local interconnect 107 in FIG. 4B; however, fourth isolation layers 2201 are formed with the local redistribution layer stack 401 instead of the first isolation layers 303. Furthermore, the local interconnect 107 formed in accordance with any of these other embodiments may be used in the formation of the integrated substrate structure 111 in any of the embodiments disclosed herein.

In FIG. 22 and with reference back to FIGS. 3, 4A and 4B, a first layer of the fourth isolation layers 2201 is formed over the first carrier substrate 301 using a lamination process to form a laminate sheet of dielectric material over the first carrier substrate 301 instead of the first layer of first isolation layers 303. The dielectric laminate sheet may be formed using materials such as a molding compound, an Ajinomoto build up film (ABF), a pre-impregnated (prepreg) material with a filler or a fiber inside, an epoxy, a phenolic ester, a cyanate ester, a phenol, a filler, glass fibers, combinations of these, or the like. Furthermore, the lamination process may comprise processes such as transfer molding, spin coating, lamination, CVD, the like, or a combination thereof. Once placed, the dielectric laminate sheet is subjected to process conditions (e.g., temperatures, pressures, times) used to laminate the dielectric laminate sheet to the surface of the first carrier substrate 301. Once laminated, an optional thinning process may be performed to planarize the surface of the fourth isolation layers 2201. The thinning process may comprise any suitable thinning process such as CMP, grinding, wet etch, dry etch, combinations, or the like. In some embodiments, the fourth isolation layers 2201 may have a thickness of between about 0.5 μm and about 30 μm. However, any suitable materials, processes, and thicknesses may be utilized for the formation of the fourth isolation layers 2201.

The first layer of the local redistribution traces 305 may be formed over the first layer of the fourth isolation layers 2201 similar to the process described above with regard to FIG. 3. Once the first layer of the local redistribution traces 305 has been formed, a first layer of second through-molding vias (TMVs) 2203 may be formed over the local redistribution traces 305. The second TMVs 2203 may be formed by initially forming a seed layer, a photoresist, a lithographic process, and a plating process in a similar process to that used for forming the first TMVs 601, described above. According to some embodiments, the second TMVs 2203 may be formed to the second critical dimension CD2 and the second height H2 as discussed above with regard to the first conductive vias 403. However, any suitable critical dimensions and any suitable heights may be used.

Once the first layer of the second TMVs 2203 has been formed, a second layer of the fourth isolation layers 2201 may be formed over the second TMVs 2203. According to some embodiments, the second layer of the fourth isolation layers 2201 may be formed using the lamination process to encapsulate the second TMVs 2203, although any suitable method may be utilized. In some embodiments, a second laminate sheet of dielectric material is placed over the exposed surfaces of the second TMVs 2203 and the exposed surfaces of the first layer of the fourth isolation layers 2201. The second laminate sheet may be formed using any of the dielectric materials and processes suitable for forming the first laminate sheet, as described above. In some embodiments, the second laminate sheet is of the same dielectric material used to form the first laminate sheet, although they may also be different. Once placed, the second dielectric laminate sheet is laminated to the exposed surfaces of the second TMVs 2203 and exposed surfaces of the first layer of the fourth isolation layers 2201. Once laminated, a thinning process may be performed to planarize the surface of the second layer of the fourth isolation layers 2201 with the second TMVs 2203. As such, the second TMVs 2203 are exposed at the planarized surface of the second layer of the fourth isolation layers 2201.

In addition, further layers of the local redistribution traces 305, the second TMVs 2203, and the fourth isolation layers 2201 may be formed one over another until an uppermost layer of the local redistribution layer stack 401 has been formed. In the illustrated embodiment, the topmost layer comprises a layer of the second TMVs 2203 that are encapsulated in a layer of the fourth isolation layers 2201. Also shown in the illustrated embodiment, five of the fourth isolation layers 2201, four of the local redistribution traces 305, and four of the second TMVs 2203 are formed in the local redistribution layer stack 401. However any suitable number of these layers may be formed in the local redistribution layer stack 401 and any of these layers may serve as the uppermost layer of the local redistribution layer stack 401.

FIG. 22 further illustrates formations of the first UBMs 409 and the external component contacts 407, in accordance with some embodiments. Once the uppermost layer of the local redistribution layer stack 401 has been formed, the first UBMs 409 may be formed over exposed surfaces of the second TMVs 2203 at the uppermost layer similar to the formation of the first UBMs 409 over the first conductive vias 403, as set forth above. Once the first UBMs 409 have been formed, the external component contacts 407 may be formed over the first UBMs 409 as set forth above. According to some embodiments, each of the local interconnects 107 comprises one or more of the local redistribution traces 305 and/or the second TMVs 2203 formed within the local interconnects 107 that electrically couple two or more of the external component contacts 407 to one another.

In still further embodiments of the local interconnects 107, the local redistribution layer stack 401 may comprise any suitable number and suitable combination of layers of the first isolation layers 303 and the fourth isolation layers 2201. For example, the first layer and/or the topmost layer of the local redistribution layer stack 401 may be a layer of the first isolation layers 303 and the remaining layers of the local redistribution layer stack 401 may be layers of the fourth isolation layers 2201. As another example, the first layer and/or the topmost layer of the local redistribution layer stack 401 may comprise a layer of the fourth isolation layers 2201 and the remaining layers of the local redistribution layer stack 401 may comprise layers of the first isolation layers 303. These examples are intended to be illustrative and are not intended to be limiting. Rather, any suitable combination of the layers of the first isolation layers 303 and the fourth isolation layers 2201 may be used in forming the local redistribution layer stack 401. All such combinations are fully intended to be included within the scope of the embodiments. Once the local redistribution layer stack 401 has been formed, the local redistribution layer stack 401 may be singulated into the individual components of the local interconnects 107 as set forth above with regard to FIGS. 4A and 4B.

Although several methods are described above for the formation of the local redistribution layer stack 401, these are intended to be illustrative and are not intended to be limiting. Rather, any suitable method of forming the local redistribution layer stack 401 may be utilized. For example, the local redistribution traces 305 may be formed using a damascene process in which the respective layer of the first isolation layers 303 (e.g., low-k dielectric material) is patterned and etched utilizing photolithography techniques to form trenches corresponding to the desired pattern of local redistribution traces 305 and/or first conductive vias 403. An optional diffusion barrier and/or optional adhesion layer may be deposited and the trenches may be filled with a conductive material (e.g., copper). Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the local redistribution traces 305 may be formed by depositing a seed layer of copper or a copper alloy, and filling the trenches by electroplating. A chemical mechanical planarization (CMP) may be used to remove excess conductive material from a surface of the first isolation layers 303 and to planarize the surface for subsequent processing. All such methods are fully intended to be included within the scope of the embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages including the production of highly integrated SoIS packages having a very low resistance and very low latency design in a very small footprint and having high component and board level reliability. In embodiments in which the thinning process removes the capture pads 505 and the external component contacts 407 and the third conductive vias 1403 are directly bonded to the first UBMs 409, the integrated substrate structure 111 and the local interconnects 107 provide very low resistance and very low latency interconnects between connected semiconductor devices 106 (e.g., chip to chip, chip to memory, or the like). As such, the system package 100 is resistant to chip package integration (CPI) and electro-migration (EM) issues (e.g., corner C4 bump fatigue, C4 joint yield, and/or the like) even for component sizes greater than or equal to 2.0 reticles, package sizes greater than or equal to 70 mm$^2$ (e.g., 70 mm*70 mm), and bump pitches less than or equal to between about 130 µm. In the embodiments of forming the integrated substrate structure 111 in which the thinning process is omitted, production time is reduced and production costs are minimized for the production of the highly integrated system packages, while still providing a low resistance and low latency paths for connected semiconductor devices in a small footprint. As such, the system package 100 may be used in advanced networking and server applications (e.g., high performance computing (HPC), AI (Artificial Intelligence), or the like) which operate with high data rates, high bandwidth demands and low latency. Further still, with wafer level techniques used during fabrication in a silicon fabrication environment increases system packaging reliability with high substrate yields may also be achieved.

According to an embodiment, a method includes: forming conductive pads over a first carrier substrate; bonding a local organic interconnect to the conductive pads, wherein the local organic interconnect includes a second carrier substrate; encapsulating the local organic interconnect and the conductive pads in a molding compound; removing the second carrier substrate by planarizing the molding compound with a passivation material of the local organic interconnect; forming a first redistribution layer adjacent to the molding compound; forming a first external connector adjacent to the first redistribution layer; and forming a second external connector over the first redistribution layer, the second external connector being electrically coupled to the first external connector through a local redistribution line, the local redistribution line being embedded within the passivation material of the local organic interconnect. In an embodiment of the method, forming the first redistribution layer includes: removing the conductive pads from an under-bump metallization of the local organic interconnect; and forming conductive features of the first redistribution layer to the under-bump metallization. In an embodiment of the method, forming the first redistribution layer includes forming conductive features of the first redistribution layer to the conductive pads. In an embodiment of the method, the local redistribution line has a thickness of at least 0.5 µm. In an embodiment of the method, the local redistribution line has a first critical dimension of at least 2 µm. In an embodiment of the method, bonding the local organic interconnect includes performing a solder reflow on solder contacts of the local organic interconnect. In an embodiment, the method further includes: forming a through via over the first carrier substrate adjacent the conductive pads; encapsulating the through via in the molding compound with the local organic interconnect and the conductive pads; forming a second redistribution layer adjacent to a backside of the local organic interconnect, the second redistribution layer being electrically coupled to the first redistribution layer by the through via; and attaching an external connector to the second redistribution layer, the external connector being electrically coupled to the local organic interconnect.

In another embodiment, a method includes: forming a first capture pad and a second capture pad over a carrier substrate; attaching a local interconnect to the first capture pad and the second capture pad, the first capture pad being electrically coupled to the second capture pad by a local conductive trace embedded within a passivation material of the local interconnect; forming a backside redistribution layer over and electrically coupled to the local interconnect; forming a first external connector over the backside redistribution layer; and forming a second external connector over the backside redistribution layer, the second external connector being electrically coupled to the first external connector through the local conductive trace. In an embodiment of the method, attaching the local interconnect includes bonding the first capture pad to a first under-bump metallization of the local interconnect and bonding the second capture pad to a second under-bump metallization of the local interconnect. In an embodiment of the method, the bonding includes performing a solder reflow between a first external contact of the local interconnect and the first capture pad and between a second external contact of the local interconnect and the second capture pad. In an embodiment of the method, forming the backside redistribution layer further includes forming a first redistribution line over and electrically coupled to the first under-bump metallization and forming a second redistribution line over and electrically coupled to the second under-bump metallization. In an embodiment of the method, forming the first redistribution line and the second redistribution line further includes: removing the first capture pad, the second capture pad, the first external contact, and the second external contact; forming the first redistribution line in contact with the first under-bump metallization; and forming the second redistribution line in contact with the second under-bump metallization. In an embodiment of the method, forming the first redistribution line and the second redistribution line further includes: forming the first redistribution line over and electrically coupled to the first capture pad; and forming the second redistribution line over and electrically coupled to the second capture pad. In an embodiment, the method further includes: forming a through molding via over the carrier substrate adjacent the first capture pad; removing a support substrate from a backside of the local interconnect by planarizing the through molding via with the passivation material of the local interconnect; forming a front side redistribution layer over the through molding via, the through molding via electrically coupling the front side redistribution layer to the backside redistribution layer; and forming a third external connector over the backside redistribution layer, the third external connector being electrically coupled to the front side redistribution layer by the through molding via. In an embodiment, the method further includes attaching an interconnect structure to a side of the front side redistribution layer opposite the through molding via.

According to yet another embodiment, a semiconductor system package includes: a local organic interconnect including a local conductive trace embedded in a passivation material; a backside redistribution layer over the local organic interconnect, the backside redistribution layer being electrically coupled to the local organic interconnect; a first external connector electrically coupled to the local organic interconnect by the backside redistribution layer; and a second external connector electrically coupled to the local organic interconnect by the backside redistribution layer, the second external connector being electrically coupled to the first external connector by the local conductive trace. In an embodiment of the system package, the local organic interconnect further includes: a first under-bump metallization electrically coupling the first external connector to the local conductive trace; and a second under-bump metallization electrically coupling the second external connector to the local conductive trace. In an embodiment of the system package, the local organic interconnect further includes: a first capture pad electrically coupling the first under-bump metallization to the backside redistribution layer; and a second capture pad electrically coupling the first under-bump metallization to the backside redistribution layer. In an embodiment of the system package, the first under-bump metallization and the second under-bump metallization are in physical contact with the backside redistribution layer. In an embodiment, the system package further includes: a through molding via embedded in the passivation material; a front side redistribution layer adjacent the through molding via, the through molding via electrically coupling the front side redistribution layer to the backside redistribution layer; and a third external connector over the backside redistribution layer, the third external connector being electrically coupled to the front side redistribution layer by the through molding via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor system package comprising:
    a through via with a first side that is coplanar with a first underfill;
    a local organic interconnect, the local organic interconnect having a first side and a second side opposite the first side, the local organic interconnect having electrical connections on the first side, the local organic interconnect being free of electrical connections on the second side, the first side of the local organic interconnect in physical contact with the first underfill;
    an encapsulant encapsulating both the through via and the local organic interconnect, wherein the encapsulant is formed of a different material than the first underfill;
    a first plurality of redistribution layers on the second side of the local organic interconnect;
    a second plurality of redistribution layers on the second side of the local organic interconnect; and
    an interconnect structure bonded to the first plurality of redistribution layers.

2. The semiconductor system package of claim 1, wherein the local organic interconnect comprises a redistribution trace with a first line width of between about 0.5 μm and about 10 μm.

3. The semiconductor system package of claim 2, wherein the redistribution trace has a thickness of between about 0.5 μm and about 10 μm.

4. The semiconductor system package of claim 1, wherein the interconnect structure comprises:
    a core substrate; and
    core substrate through vias extending through the core substrate to connect a third plurality of redistribution layers to a fourth plurality of redistribution layers.

5. The semiconductor system package of claim 1, wherein the through vias have a thickness of between about 5 μm and about 100 μm.

6. The semiconductor system package of claim 1, further comprising a first semiconductor die bonded to the first redistribution layer and in electrical connection with the local organic interconnect.

7. The semiconductor system package of claim 6, further comprising:
    a second semiconductor die bonded to the first redistribution layer; and
    a second local organic interconnect bonded to the first redistribution layer, the second local organic interconnect electrically connecting the first semiconductor die to the second semiconductor die.

8. A semiconductor system package comprising:
    a first semiconductor die bonded to a first redistribution layer;
    a local organic interconnect bonded to the first redistribution layer, the local organic interconnect being encapsulated within an encapsulant;
    a second semiconductor die bonded to the first redistribution layer;

a second local organic interconnect bonded to the first redistribution layer, the second local organic interconnect electrically connecting the first semiconductor die to the second semiconductor die;

a second redistribution layer on an opposite side of the local organic interconnect from the first redistribution layer;

through vias extending through the encapsulant from the first redistribution layer to the second redistribution layer; and an interconnect structure bonded to the second redistribution layer, the interconnect structure comprising:
a core substrate; and
core substrate through vias extending through the core substrate to connect a third redistribution layer to a fourth redistribution layer.

9. The semiconductor system package of claim 8, further comprising:
a third semiconductor die bonded to the first redistribution layer; and
a third local organic interconnect bonded to the first redistribution layer, the third local organic interconnect electrically connecting the first semiconductor die to the third semiconductor die.

10. The semiconductor system package of claim 8, wherein the through vias have a height no greater than 100 µm.

11. The semiconductor system package of claim 8, further comprising an underfill adjacent to the local organic interconnect, the underfill being coplanar with the through vias.

12. The semiconductor system package of claim 8, wherein a redistribution trace within the local organic interconnect has a first line width of between about 0.5 µm and about 10 µm.

13. The semiconductor system package of claim 12, wherein the redistribution trace has a thickness of between about 0.5 µm and about 10 µm.

14. The semiconductor system package of claim 8, wherein the through vias have a thickness of between about 5 µm and about 100 µm.

15. The semiconductor system package of claim 8, further comprising an underfill disposed between the local organic interconnect and the first redistribution layer, the underfill being different from the encapsulant.

16. A semiconductor system package comprising:
a local organic interconnect comprising a local conductive trace embedded in a passivation material;
a backside redistribution layer over the local organic interconnect, the backside redistribution layer being electrically coupled to the local organic interconnect;
a first external connector electrically coupled to the local organic interconnect by the backside redistribution layer; and
a second external connector electrically coupled to the local organic interconnect by the backside redistribution layer, the second external connector being electrically coupled to the first external connector by the local conductive trace.

17. The semiconductor system package of claim 16, wherein the local organic interconnect further comprises:
a first under-bump metallization electrically coupling the first external connector to the local conductive trace; and
a second under-bump metallization electrically coupling the second external connector to the local conductive trace.

18. The semiconductor system package of claim 17, wherein the local organic interconnect further comprises:
a first capture pad electrically coupling the first under-bump metallization to the backside redistribution layer; and
a second capture pad electrically coupling the first under-bump metallization to the backside redistribution layer.

19. The semiconductor system package of claim 17, wherein the first under-bump metallization and the second under-bump metallization are in physical contact with the backside redistribution layer.

20. The semiconductor system package of claim 16, further comprises:
a through molding via embedded in the passivation material;
a front side redistribution layer adjacent the through molding via, the through molding via electrically coupling the front side redistribution layer to the backside redistribution layer; and
a third external connector over the backside redistribution layer, the third external connector being electrically coupled to the front side redistribution layer by the through molding via.

* * * * *